United States Patent [19]

Belsan

[11] Patent Number: 5,155,835
[45] Date of Patent: Oct. 13, 1992

[54] MULTILEVEL, HIERARCHICAL, DYNAMICALLY MAPPED DATA STORAGE SUBSYSTEM

[75] Inventor: Jay S. Belsan, Nederland, Colo.

[73] Assignee: Storage Technology Corporation, Louisville, Colo.

[21] Appl. No.: 615,329

[22] Filed: Nov. 19, 1990

[51] Int. Cl.⁵ .................. G06F 13/00; G06F 12/08
[52] U.S. Cl. ................. 395/425; 364/DIG. 1
[58] Field of Search ............ 364/200, 900; 365/49, 365/189.07

[56] References Cited

U.S. PATENT DOCUMENTS

| | | | |
|---|---|---|---|
| 4,084,231 | 4/1978 | Capozzi et al. | 364/200 |
| 4,467,421 | 8/1984 | White | 364/200 |
| 4,636,946 | 1/1987 | Hartung et al. | 364/200 |
| 4,876,662 | 10/1989 | Pence | 364/900 |
| 4,916,605 | 4/1990 | Beardsley et al. | 364/200 |
| 4,987,533 | 1/1991 | Clark et al. | 364/200 |

Primary Examiner—Alyssa H. Bowler
Attorney, Agent, or Firm—Dorr, Carson, Sloan & Peterson

[57] ABSTRACT

The disk drive array data storage subsystem functions as a conventional large form factor disk drive memory, using an array of redundancy groups, each containing N+M disk drives. The data storage subsystem does not modify data stored in a redundancy group but simply writes the modified data as a new record in available memory space on another redundancy group. The original data is flagged as obsolete. Virtual tracks that are least used are migrated as part of a free space collection process to low access cylinders, which are, in turn, migrated to secondary media, such as magnetic tape. The migration process is either periodic or demand driven to automatically archive little used data records.

40 Claims, 15 Drawing Sheets

LOGICAL CYLINDER DIRECTORY (LCD)

| LOGICAL CYLINDER SEQUENCE NUMBER | LOGICAL ADDRESS | LCD ENTRY COUNT | LOGICAL CYLINDER COLLECTION HISTORY | LCD ENTRY | LCD ENTRY | LCD ENTRY | LCD ENTRY | LCD ENTRY |
|---|---|---|---|---|---|---|---|---|

LCD ENTRY:

| VIRTUAL ADDRESS | SECTOR OFFSET |
|---|---|

FIG. 12.

FREE SPACE DIRECTORY ENTRY

| BYTE | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| | FREE SECTOR COUNT | FORWARD POINTER | | BACKWARD POINTER | | FLAG BYTE (LCT) | ACCESS CNTR | CREATION TIME/DATE | | | | LAST ACCESS TIME/DATE | | | |

FLAG BYTE (LCT):
COLLECTED FLAG
ARCHIVE FLAG

FIG. 14.

MULTILEVEL, HIERARCHICAL, DYNAMICALLY MAPPED DATA STORAGE SUBSYSTEM

CROSS-REFERENCE TO RELATED APPLICATIONS

This patent application is related to application Ser. No. 07/443,933, now abandoned entitled Data Record Copy Apparatus for a Virtual Memory System, filed Nov. 30, 1989, application Ser. No. 07/443,895 now abandoned entitled Data Record Move Apparatus for a Virtual Memory System, filed Nov. 30, 1989, application Ser. No. 07/509,484 now U.S. Pat. No. 5,124,987 entitled Logical Track Write Scheduling System for a Parallel Disk Drive Array Data Storage Subsystem, filed Apr. 16, 1990, and application Ser. No. 07/582,260 entitled Incremental Disk Backup System for a Dynamically Mapped Data Storage Subsystem, filed Sep. 12 1990.

FIELD OF THE INVENTION

This invention relates to cached peripheral data storage subsystems with a dynamically mapped architecture and, in particular, to a method for automatically distributing data records to various classes of data storage elements in or associated with this data storage subsystem as a function of the data record access frequency.

PROBLEM

It is a problem in the field of data storage systems to efficiently store data records. In data storage systems, it is a standard practice to provide a number of classes of data storage media so that each data record can be stored on a media that reflects the frequency and speed of access required for this data record. Thus, transaction based data records which require frequent and fast access are stored in the expensive but fast access time solid state memory or DASD data storage elements while less frequently used data records can be stored on less expensive and slower access time media, such as magnetic tape. A difficulty with such aggregate systems is that the assignment of a data record to a particular type of media is manually performed and, as a result, rarely updated. This results in a significant cost penalty as much of the data in the data storage system at any point in time is stored on an inappropriate class of media.

SOLUTION

The above described problems are solved and a technical advance achieved in the field by the multilevel, hierarchical, dynamically mapped data storage system which automatically assigns data records to a class of data storage media as a function of the frequency of use and type of data record. The dynamically mapped data storage system includes a disk drive array data storage subsystem. The disk drive array switchably interconnects a plurality of disk drives into redundancy groups that each contain N+M data and redundancy disk drives. Data records received from the associated host processors are written on logical tracks in a redundancy group that contains an empty logical cylinder. When an associated host processor modifies data records stored in a redundancy group, the disk array data storage subsystem writes the modified data records into empty logical cylinders instead of modifying the data records at their present storage location. The modified data records are collected in a cache memory until a sufficient number of virtual tracks have been modified to write out an entire logical track, whereupon the original data records are tagged as "obsolete". All logical tracks of a single logical cylinder are thus written before any data is scheduled to be written to a different logical cylinder.

A mapping table is easily maintained in memory of this data storage system to indicate which of the logical cylinders contained in the disk drive array data storage subsystem contain modified data records, which contain unmodified and obsolete data records and what is the frequency of access to each of these data records. By maintaining this memory map, the data storage subsystem can easily identify the frequency of access of all logical cylinders contained in the disk drive array. This system then reads the mapping table to locate logical cylinders containing infrequently used data records that can be archived and writes only these identified logical cylinders to a slower data storage medium, such as magnetic tape, optical disk with removable platters or any other such data storage device. Once the logical cylinders are relocated to another data storage medium in this fashion, the mapping table is reset to indicate that all of the data records contained therein have been stored in a different location. This relocation of data records is independent of the host processor and takes place automatically as a function of the frequency of data record access and quantity of data records stored in disk drive array data storage subsystem. Thus, when the number of data records stored in the disk drive array data storage subsystem exceeds a predetermined amount, the least used data records are migrated to slower data storage media. This enables the data storage system to automatically adapt its operation to the particular needs of the host processor and the data presently processed therein.

BRIEF DESCRIPTION OF THE DRAWING

FIG. 12 illustrates the format of the Logical Cylinder Directory;

FIG. 14 illustrates a typical free space directory entry;

DETAILED DESCRIPTION OF THE DRAWING

Figure 1:
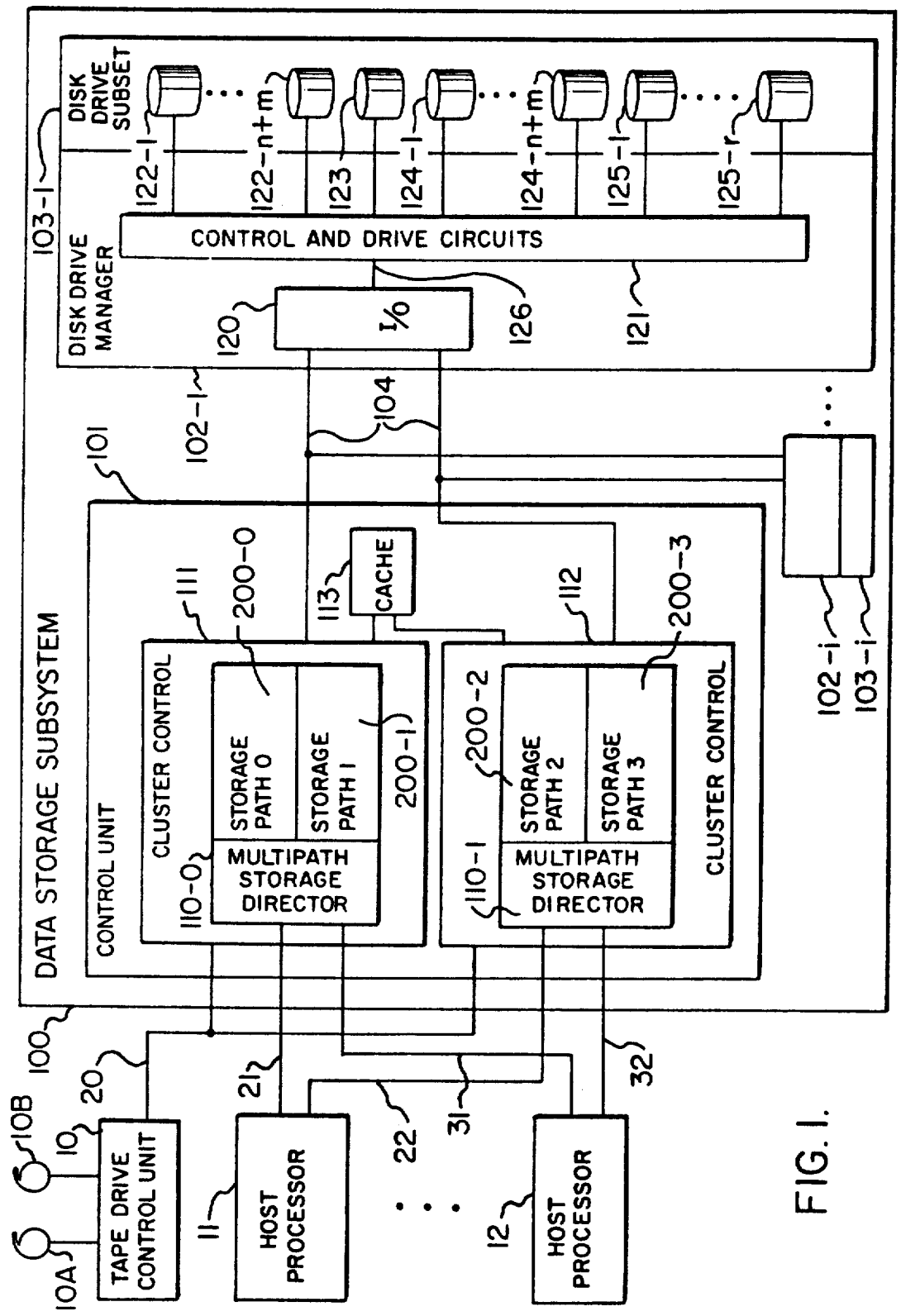
FIG. 1 illustrates in block diagram form the architecture of the parallel disk drive array data storage subsystem.

The data storage system of the present invention includes a disk drive array data storage subsystem that uses a plurality of small form factor disk drives in place of a single large form factor disk drive to implement an inexpensive, high performance, high reliability disk drive memory that emulates the format and capability of large form factor disk drives. This system avoids the parity update problem of the prior art by never updating the parity. Instead, all new or modified data is written on empty logical tracks and the old data is tagged as obsolete. The resultant "holes" in the logical tracks caused by old data are removed by a background free-space collection process that creates empty logical tracks by collecting valid data into previously emptied logical tracks.

The plurality of disk drives in the disk drive array data storage subsystem are configured into a plurality of variable size redundancy groups of N+M disk drives to store data thereon. Each redundancy group, also called a logical disk drive, is divided into a number of logical cylinders, each containing i logical tracks, one logical track for each of the i physical tracks contained in a cylinder of one physical disk drive. Each logical track is comprised of N+M physical tracks, one physical track from each disk drive in the redundancy group. The N+M disk drives are used to store N data segments, one on each of N physical tracks per logical track, and to store M redundancy segments, one on each of M physical tracks per logical track in the redundancy group. The N+M disk drives in a redundancy group have unsynchronized spindles and loosely coupled actuators. The data is transferred to the disk drives via independent reads and writes since all disk drives operate independently. Furthermore, the M redundancy segments, for successive logical cylinders, are distributed across all the disk drives in the redundancy group rather than using dedicated redundancy disk drives. The redundancy segments are distributed so that every actuator in a redundancy group is used to access some of the data segments stored on the disk drives.

The disk drive array data storage subsystem includes a data storage management system that provides improved data storage and retrieval performance by dynamically mapping between virtual and physical data storage devices. The disk drive array data storage subsystem consists of three abstract layers: virtual, logical and physical. The virtual layer functions as a conventional large form factor disk drive memory. The logical layer functions as an array of storage units that are grouped into a plurality of redundancy groups, each containing N+M physical disk drives. The physical layer functions as a plurality of individual small form factor disk drives. The data storage management system operates to effectuate the dynamic mapping of data among these abstract layers and to control the allocation and management of the actual space on the physical devices. These data storage management functions are performed in a manner that renders the operation of the disk drive array data storage subsystem transparent to the host processor which perceives only the virtual image of the disk drive array data storage subsystem.

The performance of this system is enhanced by the use of a cache memory with both volatile and non-volatile portions and "backend" data staging and destaging processes. Data received from the host processors are stored in the cache memory in the form of modifications to data records already stored in the redundancy groups of the data storage subsystem. No data stored in a redundancy group is modified. A virtual track is staged from a redundancy group into cache. The host then modifies some, perhaps all, of the data records on the virtual track. Then, as determined by cache replacement algorithms such as Least Recently Used, etc, the modified virtual track is selected to be destaged to a redundancy group. When thus selected, a virtual track is divided (marked off) into several physical sectors to be stored on one or more physical tracks of one or more logical tracks. A complete physical track may contain physical sectors from one or more virtual tracks. Each physical track is combined with N−1 other physical tracks to form the N data segments of a logical track.

The original, unmodified data is simply flagged as obsolete. Obviously, as data is modified, the redundancy groups increasingly contain numerous virtual tracks of obsolete data. The remaining valid virtual tracks in a logical cylinder are read to the cache memory in a background "free space collection" process. They are then written to a previously emptied logical cylinder and the "collected" logical cylinder is tagged as being empty. Thus, all redundancy data creation, writing and free space collection occurs in background, rather than on-demand processes. This arrangement avoids the parity update problem of existing disk array systems and improves the response time versus access rate performance of the data storage subsystem by transferring these overhead tasks to background processes.

Therefore, a mapping table is maintained in memory to indicate which of the logical cylinders contained in the disk drive array data storage subsystem contain modified data records and which contain obsolete and unmodified data records. By maintaining the memory map, the data storage system can also easily identify the frequency of usage of the data record in all logical cylinders contained in the disk drive array. This system then reads the mapping table to locate logical cylinders containing infrequently accessed data records and writes these archivable logical cylinders to the archive media. Once the logical cylinders are archived in this fashion, the mapping table is reset to indicate that all of the data contained therein has been relocated.

This relocation of data records is independent of the host processor and takes place automatically as a function of the frequency of data record access and quantity of data records stored in disk drive array data storage subsystem. Thus, when the number of data records stored in the disk drive array data storage subsystem exceeds a predetermined amount, the least used data records are migrated to slower data storage media. This enables the data storage system to automatically adapt its operation to the particular needs of the host processor and the data presently processed therein.

Data Storage Subsystem Architecture

FIG. 1 illustrates in block diagram form the architecture of the preferred embodiment of the data storage system 1, including disk drive array data storage subsystem 100. The disk drive array data storage subsystem 100 appears to the associated host processors 11-12 to be a collection of large form factor disk drives with their associated storage control, since the architecture of disk drive array data storage subsystem 100 is transparent to the associated host processors 11-12. This disk drive array data storage subsystem 100 includes a plurality of disk drives (ex 122-1 to 125-r) located in a plurality of disk drive subsets 103-1 to 103-i. The disk drives 122-1 to 125-r are significantly less expensive, even while providing disk drives to store redundancy information and providing disk drives for spare purposes, than the typical 14 inch form factor disk drive with an associated backup disk drive. The plurality of disk drives 122-1 to 125-r are typically the commodity hard disk drives in the 5¼ inch form factor.

The architecture illustrated in FIG. 1 is that of a plurality of host processors 11-12 interconnected via the respective plurality of data channels 21, 22-31, 32, respectively to a data storage subsystem 100 that provides the backend data storage capacity for the host processors 11-12. This basic configuration is well known in the data processing art. The data storage subsystem 100 includes a control unit 101 that serves to interconnect the subsets of disk drives 103-1 to 103-i and their associated drive managers 102-1 to 102-i with the data channels 21-22, 31-32 that interconnect data storage subsystem 100 with the plurality of host processors 11, 12.

Control unit 101 includes typically two cluster controls 111, 112 for redundancy purposes. Within a cluster control 111 the multipath storage director 110-0 provides a hardware interface to interconnect data channels 21, 31 to cluster control 111 contained in control unit 101. In this respect, the multipath storage director 110-0 provides a hardware interface to the associated data channels 21, 31 and provides a multiplex function to enable any attached data channel ex-21 from any host processor ex-11 to interconnect to a selected cluster control 111 within control unit 101. The cluster control 111 itself provides a pair of storage paths 201-0, 201-1 which function as an interface to a plurality of optical fiber backend channels 104. In addition, the cluster control 111 includes a data compression function as well as a data routing function that enables cluster control 111 to direct the transfer of data between a selected data channel 21 and cache memory 113, and between cache memory 113 and one of the connected optical fiber backend channels 104. Control unit 101 provides the major data storage subsystem control functions that include the creation and regulation of data redundancy groups, reconstruction of data for a failed disk drive, switching a spare disk drive in place of a failed disk drive, data redundancy generation, logical device space management, and virtual to logical device mapping. These subsystem functions are discussed in further detail below.

Disk drive manager 102-1 interconnects the plurality of commodity disk drives 122-1 to 125-r included in disk drive subset 103-1 with the plurality of optical fiber backend channels 104. Disk drive manager 102-1 includes an input/output circuit 120 that provides a hardware interface to interconnect the optical fiber backend channels 104 with the data paths 126 that serve control and drive circuits 121. Control and drive circuits 121 receive the data on conductors 126 from input/output circuit 120 and convert the form and format of these signals as required by the associated commodity disk drives in disk drive subset 103-1. In addition, control and drive circuits 121 provide a control signalling interface to transfer signals between the disk drive subset 103-1 and control unit 101. The data that is written onto the disk drives in disk drive subset 103-1 consists of data that is transmitted from an associated host processor 11 over data channel 21 to one of cluster controls 111, 112 in control unit 101. The data is written into, for example, cluster control 111 which stores the data in cache 113. Cluster control 111 stores N physical tracks of data in cache 113 and then generates M redundancy segments for error correction purposes. Cluster control 111 then selects a subset of disk drives (122-1 to 122-n+m) to form a redundancy group to store the received data. Cluster control 111 selects an empty logical track, consisting of N+M physical tracks, in the selected redundancy group. Each of the N physical tracks of the data are written onto one of N disk drives in the selected data redundancy group. An additional M disk drives are used in the redundancy group to store the M redundancy segments. The M redundancy segments include error correction characters and data that can be used to verify the integrity of the N physical tracks that are stored on the N disk drives as well as to reconstruct one or more of the N physical tracks of the data if that physical track were lost due to a failure of the disk drive on which that physical track is stored.

Thus, data storage subsystem 100 can emulate one or more large form factor disk drives (ex—an IBM 3380 K type of disk drive) using a plurality of smaller form factor disk drives while providing a high system reliability capability by writing the data across a plurality of the smaller form factor disk drives. A reliability improvement is also obtained by providing a pool of R spare disk drives (125-1 to 125-r) that are switchably interconnectable in place of a failed disk drive. Data reconstruction is accomplished by the use of the M redundancy segments, so that the data stored on the remaining functioning disk drives combined with the redundancy information stored in the redundancy segments can be used by control software in control unit 101 to reconstruct the data lost when one or more of the plurality of disk drives in the redundancy group fails (122-1 to 122-n+m). This arrangement provides a reliability capability similar to that obtained by disk shadowing arrangements at a significantly reduced cost over such an arrangement.

Disk Drive

Each of the disk drives 122-1 to 125-r in disk drive subset 103-1 can be considered a disk subsystem that consists of a disk drive mechanism and its surrounding control and interface circuitry. The disk drive consists of a commodity disk drive which is a commercially available hard disk drive of the type that typically is used in personal computers. A control processor associated with the disk drive has control responsibility for the entire disk drive and monitors all information routed over the various serial data channels that connect each disk drive 122-1 to 125-r to control and drive circuits 121. Any data transmitted to the disk drive over these channels is stored in a corresponding interface buffer which is connected via an associated serial data channel to a corresponding serial/parallel converter circuit. A disk controller is also provided in each disk drive to implement the low level electrical interface required by the commodity disk drive. The commodity disk drive has an ESDI interface which must be interfaced with control and drive circuits 121. The disk controller provides this function. Disk controller provides serialization and deserialization of data, CRC/ECC generation, checking and correction and NRZ data encoding. The addressing information such as the head select and other type of control signals are provided by control and drive circuits 121 to commodity disk drive 122-1. This communication path is also provided for diagnostic and control purposes. For example, control and drive circuits 121 can power a commodity disk drive down when the disk drive is in the standby mode. In this fashion, commodity disk drive remains in an idle state until it is selected by control and drive circuits 121.

Control Unit

Figure 2:
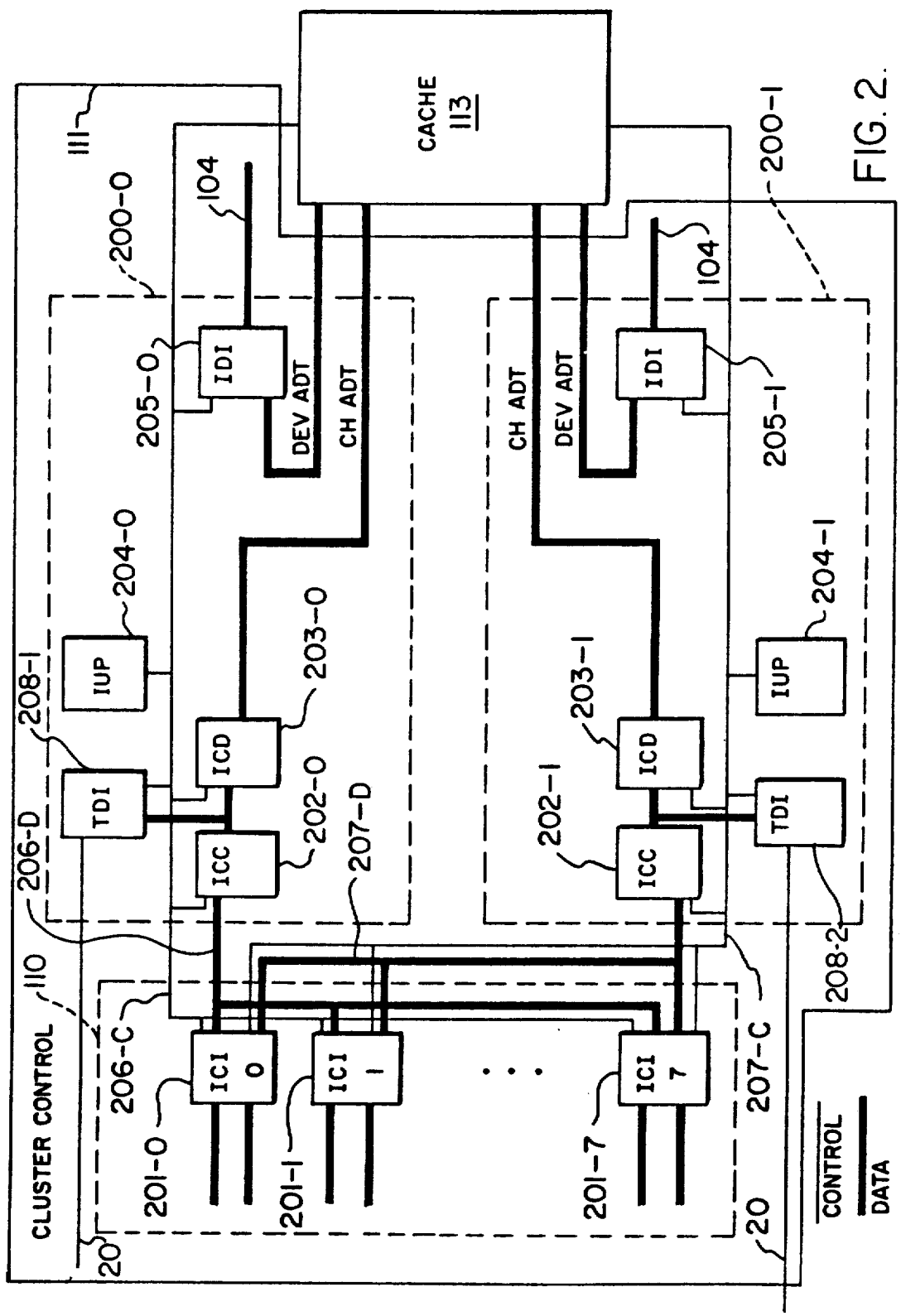
FIG. 2 illustrates the cluster control of the data storage subsystem.

FIG. 2 illustrates in block diagram form additional details of cluster control 111. Multipath storage director 110 includes a plurality of channel interface units 201-0 to 201-7, each of which terminates a corresponding pair of data channels 21, 31. The control and data signals received by the corresponding channel interface unit 201-0 are output on either of the corresponding control and data buses 206-C, 206-D, or 207-C, 207-D, respectively, to either storage path 200-0 or storage path 200-1. Thus, as can be seen from the structure of the cluster control 111 illustrated in FIG. 2, there is a significant amount of symmetry contained therein. Storage path 200-0 is identical to storage path 200-1 and only one of these is described herein. The multipath storage director 110 uses two sets of data and control busses 206-D, C and 207-D, C to interconnect each channel interface unit 201-0 to 201-7 with both storage path 200-0 and 200-1 so that the corresponding data channel 21 from the associated host processor 11 can be switched via either storage path 200-0 or 200-1 to the plurality of optical fiber backend channels 104. Within storage path 200-0 is contained a processor 204-0 that regulates the operation of storage path 200-0. In addition, an optical device interface 205-0 is provided to convert between the optical fiber signalling format of optical fiber backend channels 104 and the metallic conductors contained within storage path 200-0. Channel interface control 202-0 operates under control of processor 204-0 to control the flow of data to and from cache memory 113 and the one of channel interface units 201 that is presently active within storage path 200-0. The channel interface control 202-0 includes a cyclic redundancy check (CRC) generator/checker to generate and check the CRC bytes for the received data. The channel interface circuit 202-0 also includes a buffer that compensates for speed mismatch between the data transmission rate of the data channel 21 and the available data transfer capability of the cache memory 113. The data that is received by the channel interface control circuit 202-0 from a corresponding channel interface circuit 201 is forwarded to the cache memory 113 via channel data compression circuit 203-0. The channel data compression circuit 203-0 provides the necessary hardware and microcode to perform compression of the channel data for the control unit 101 on a data write from the host processor 11. It also performs the necessary decompression operation for control unit 101 on a data read operation by the host processor 11.

As can be seen from the architecture illustrated in FIG. 2, all data transfers between a host processor 11 and a redundancy group in the disk drive subsets 103 are routed through cache memory 113. Control of cache memory 113 is provided in control unit 101 by processor 204-0. The functions provided by processor 204-0 include initialization of the cache directory and other cache data structures, cache directory searching and management, cache space management, cache performance improvement algorithms as well as other cache control functions. In addition, processor 204-0 creates the redundancy groups from the disk drives in disk drive subsets 103 and maintains records of the status of those devices. Processor 204-0 also causes the redundancy data across the N data disks in a redundancy group to be generated within cache memory 113 and writes the M segments of redundancy data onto the M redundancy disks in the redundancy group. The functional software in processor 204-0 also manages the mappings from virtual to logical and from logical to physical devices. The tables that describe this mapping are updated, maintained, backed up and occasionally recovered by this functional software on processor 204-0. The free space collection function is also performed by processor 204-0 as well as management and scheduling of the optical fiber backend channels 104. Many of these above functions are well known in the data processing art and are not described in any detail herein.

Tape Drive Control Unit Interface

Figure 16:
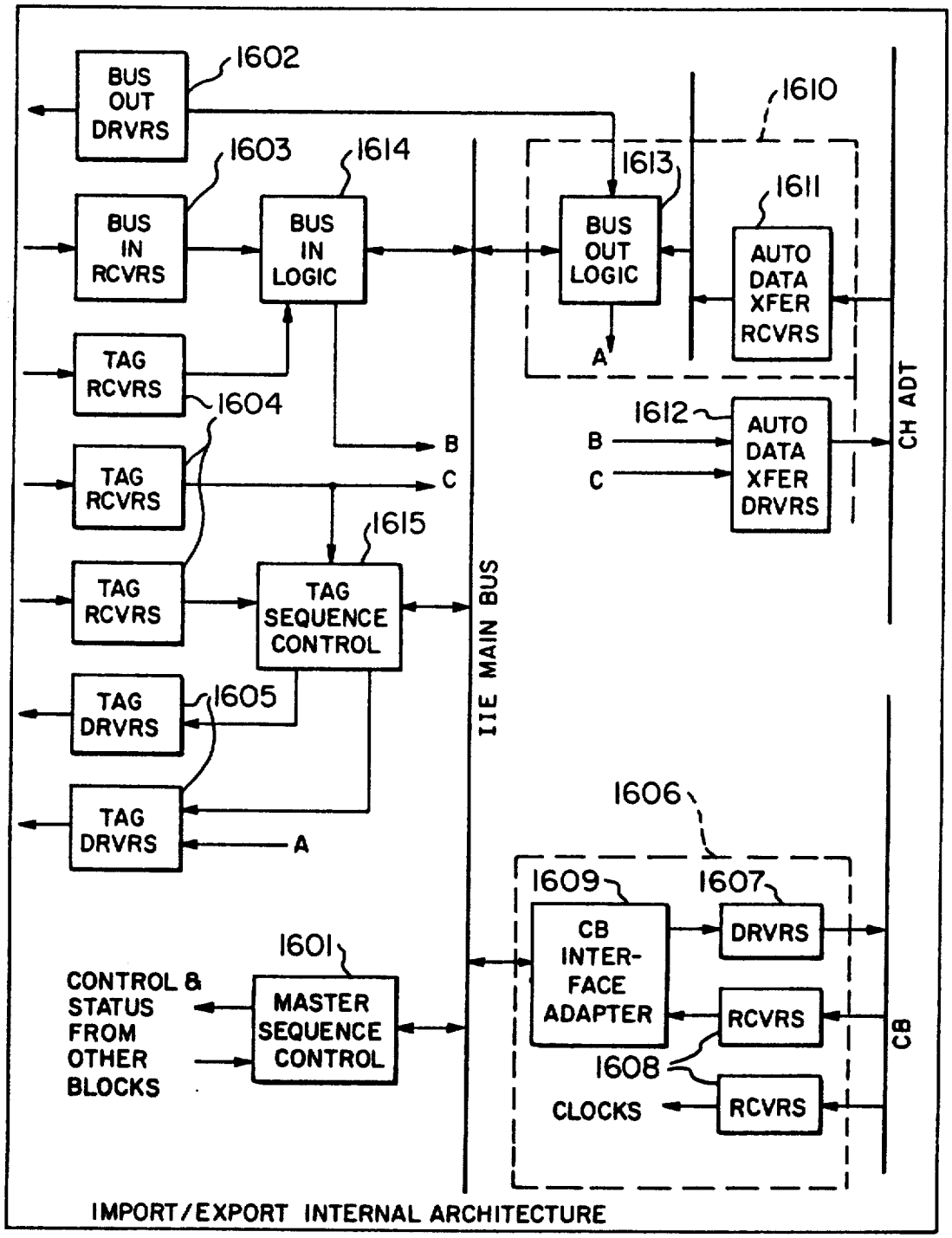
FIG. 16 illustrates additional details of the tape drive control unit interface.

FIG. 16 illustrates in block diagram form additional details of the tape drive control unit interface 208-1 which is connected via data channel 20 to tape drive control unit 10 which interconnects the data channel 20 with a plurality of tape drives. Tape drive control unit interface 208 is similar in structure to a data channel interface circuit 201 and functions like a host channel interface so that the tape drive control unit 10 believes that data channel 20 is a normal IBM OEMI type channel. FIG. 16 illustrates the master sequence control 1601 which is the main functional control of the tape drive control unit interface circuit 208. All other control function in the tape drive control unit interface circuit 208 are slaves to the master sequence control circuit 1601. Master sequence control 1601 recognizes and responds to sequences of events that occur on the data channel 20 for those initiated by elements within control cluster 111. Master sequence control 1601 contains a microsequencer, instruction memory, bus source and destination decode registers and various other registers as are well known in the art. A plurality of bus input receivers 1603 and bus output drivers 1602 and tag receivers 1604 and drivers 1605 are provided to transmit tag or bus signals to the tape drive control unit 10. These transmitters and receivers conform to the requirements set in the IBM OEMI specification so that normal IBM channels can be used to connect data storage subsystem 100 with a conventional tape drive control unit 10. The details of these drivers and receivers are well known in the art and are not disclosed in any detail herein. Control signals and data from processor 204 in cluster control 111 are received in the tape drive control unit interface 208-1 through the control bus interface 1606 which includes a plurality of drivers and receivers 1607, 1608 and an interface adapter 1609 which contains FIFOs to buffer the data transmitted between the main bus of the tape drive control unit interface circuit 208-1 and data and control busses 206-D, 206-C, respectively. Furthermore, automatic data transfer interface 1610 is used to transfer data between the tape interface drivers and receivers 1602, 1603 and cache memory 113 on bus CH ADT via receivers and transmitters 1611, 1612. Thus, the function of tape drive control unit interface circuit 208-1 is similar to that of channel interface circuits 201 and serve to interconnect a standard tape drive control 10 via data channel 20 to data storage subsystem 100 to exchange data and control information therebetween.

Disk Drive Manager

Figure 3:
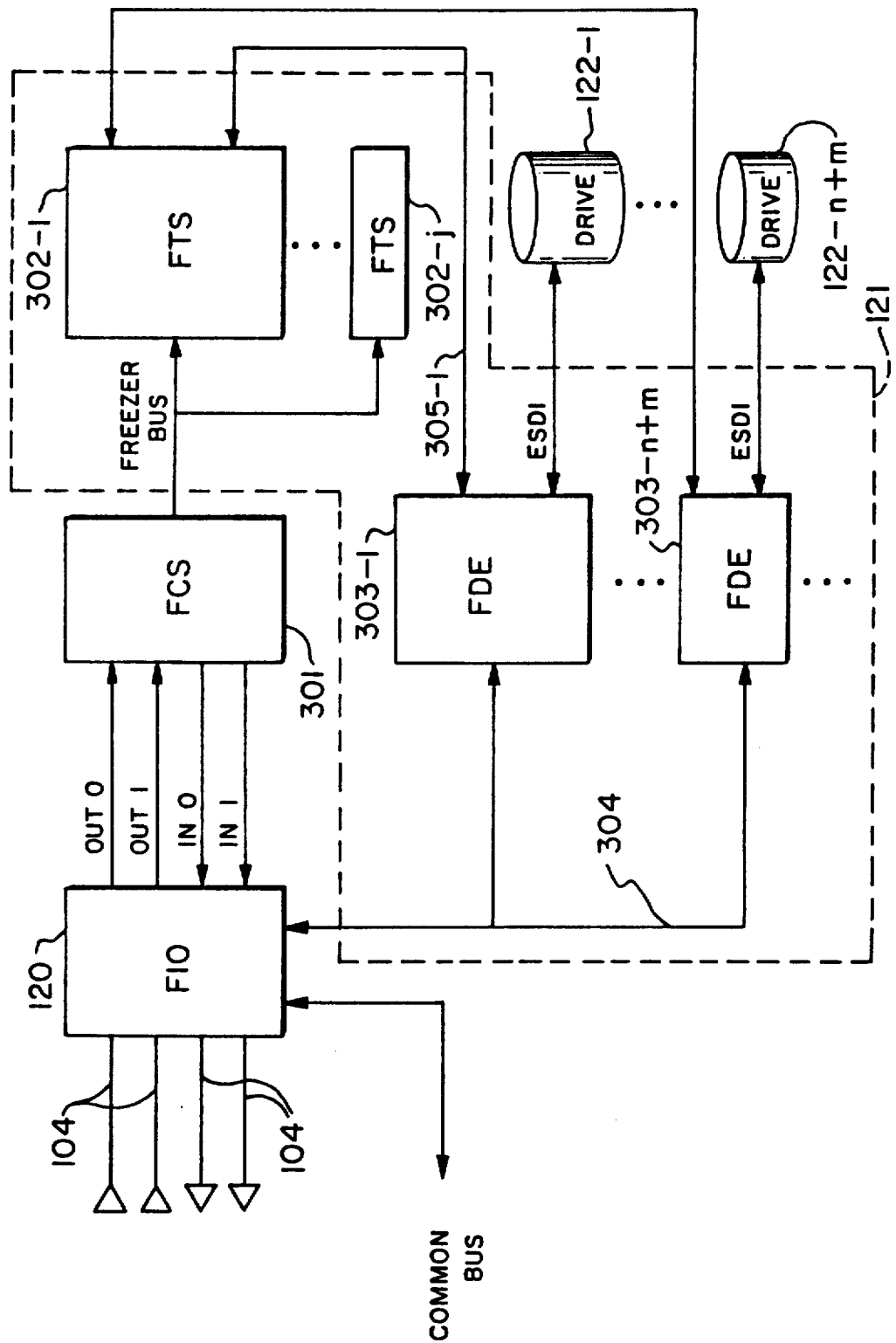
FIG. 3 illustrates the disk drive manager.

FIG. 3 illustrates further block diagram detail of disk drive manager 102-1. Input/output circuit 120 is shown connecting the plurality of optical fiber channels 104 with a number of data and control busses that interconnect input/output circuit 120 with control and drive circuits 121. Control and drive circuits 121 consist of a command and status circuit 301 that monitors and controls the status and command interfaces to the control unit 101. Command and status circuit 301 also collects data from the remaining circuits in disk drive managers 102 and the various disk drives in disk drive subsets 103 for transmission to control unit 101. Control and drive circuits 121 also include a plurality of drive electronics circuits 303, one for each of the commodity disk drives that is used in disk drive subset 103-1. The drive electronics circuits 303 control the data transfer to and from the associated commodity drive via an ESDI interface. The drive electronics circuit 303 is capable of transmitting and receiving frames on the serial interface and contains a microcontroller, track buffer, status and control registers and industry standard commodity drive interface. The drive electronics circuit 303 receives data from the input/output circuit 120 via an associated data bus 304 and control signals via control leads 305. Control and drive circuits 121 also include a plurality of subsystem circuits 302-1 to 302-j, each of which controls a plurality of drive electronics circuits 303. The subsystem circuit 302 controls the request, error and spin up lines for each drive electronics circuit 303. Typically, a subsystem circuit 302 interfaces with thirty-two drive electronics circuits 303. The subsystem circuit 302 also functions to collect environmental sense information for transmission to control unit 101 via command and status circuit 301. Thus, the control and drive circuits 121 in disk drive manager 102-1 perform the data and control signal interface and transmission function between the commodity disk drives of disk drive subset 103-1 and control unit 101.

Command and Status Circuit

Figure 4:
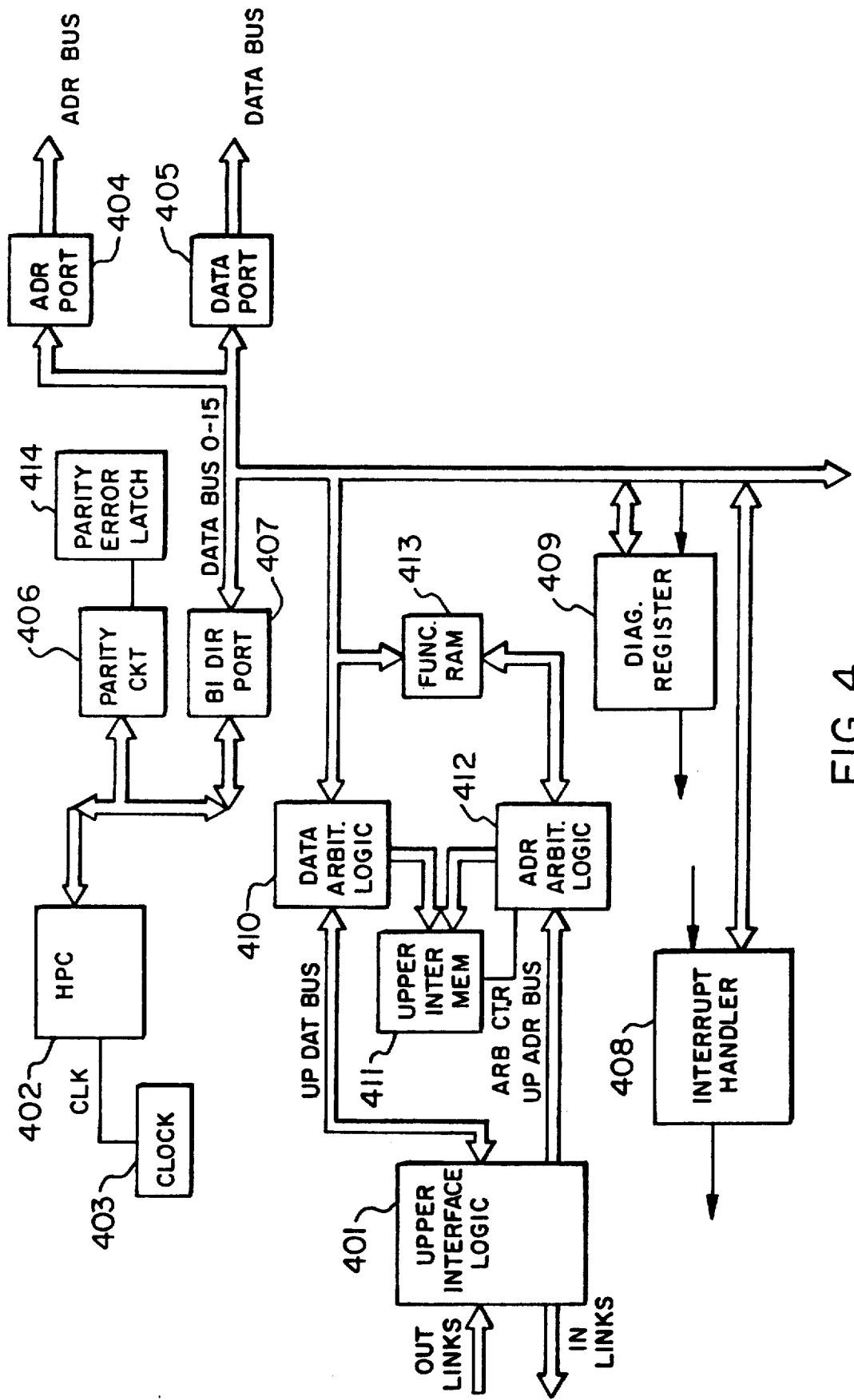
FIG. 4 illustrates the disk drive manager control circuit.

The command and status circuit 301 is illustrated in further detail in FIG. 4. The circuit has three main functions: collect status from the various subsystem circuits 302, report status to control unit 101 and provide diagnostics for disk drive manager 102-1. Command and status circuit 301 is controlled by a processor 402 and its associated clock 403. Processor 402 communicates with the address and data busses via ports 404 and 405 respectively. The direction of communication between processor and the busses and the remaining circuits in command and status circuit 301 is controlled by bidirectional port 407 which acts as an arbiter to regulate access to the internal bus of command and status circuit 301. Similarly, data and address arbitration logic circuits 410 and 412 regulate the access of the interface circuit 401 to the internal data bus of command and status circuit 301. For example, data received from input/output circuit 120 is received by the interface circuit 401 which stores this data in memory 411 via address and data busses that are connected between interface circuit 401 and the data and address arbitration logic 410 and 412. These arbitration circuits regulate access to memory 411 from the internal data bus of command and status circuit 301 and interface circuit 401. Similarly, processor 402 can access the data stored in memory 411 via the internal data bus of command and status circuit 301 and the corresponding data and address arbitration logic 410, 412. This data retrieved by processor 402 can then be output via address and data busses to the subsystem circuits 302 via address and data ports 404, 405 respectively.

Command and status circuit 301 includes interrupt handler 408. All interrupts in disk drive manager 102-1, except for reset, are brought through interrupt handler 408. Interrupt handler 408 collects all interrupts of a particular class which interrupts are read by interrupt software in processor 402. The interrupt software reads the memory mapped space in interrupt handler 408 to determine the bit pattern which indicates what interrupt has occurred.

Drive Electronics Circuit

Figure 5:
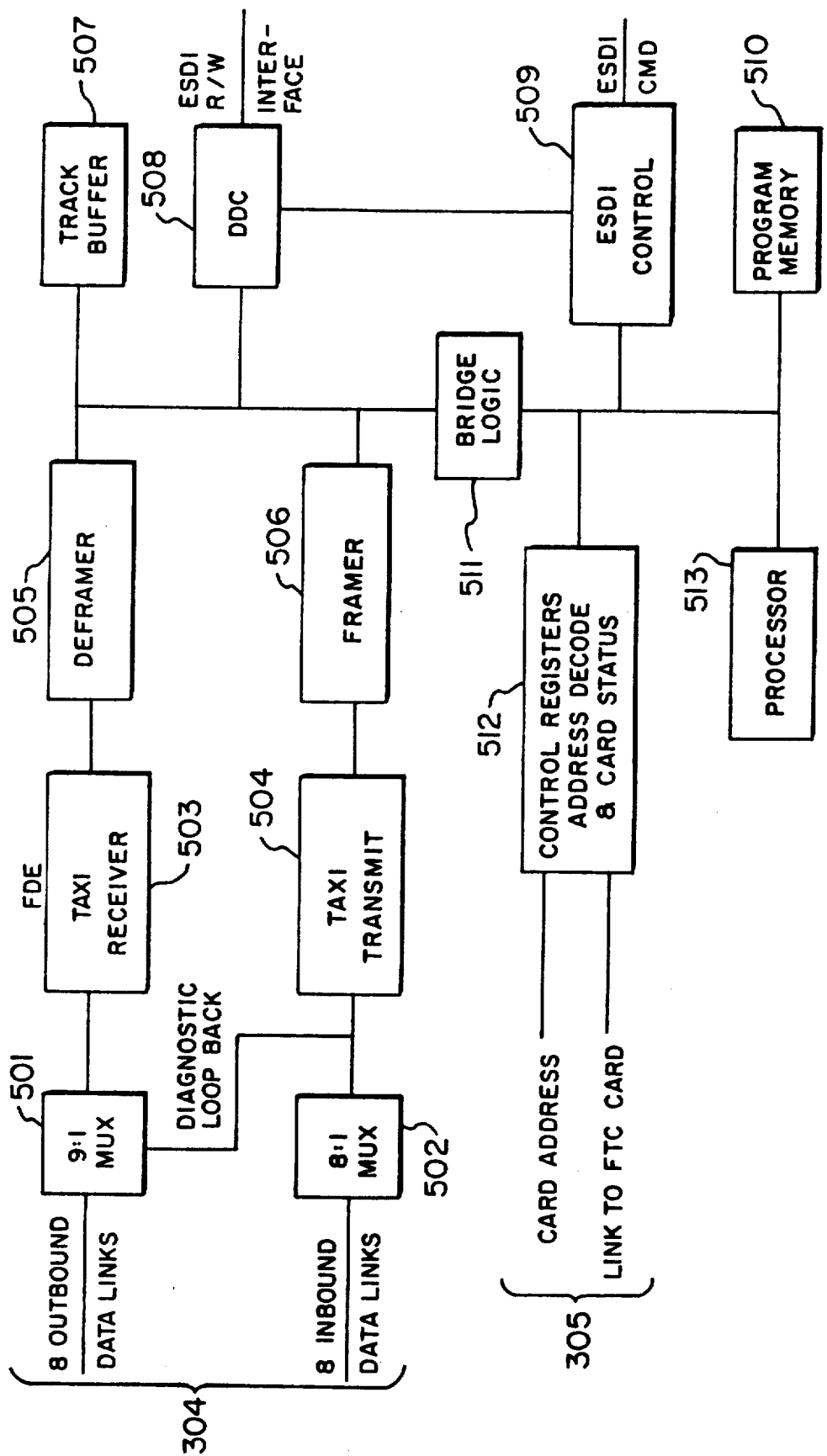
FIG. 5 illustrates the disk drive manager disk control electronics.

The drive electronics circuit 303 functions as an interface between the serial data links 304 that interconnect the input/output circuit 120 and the industry standard commodity disk drive such as drive 122-1. FIG. 5 illustrates additional details of drive electronics circuit 303. The serial data links 304 consist of eight outbound data links and eight inbound data links that are coupled via multiplexers 501 and 502 respectively to the internal circuitry of drive electronics circuit 303. Receiver 503 monitors the outbound data links and converts the information received from input/output circuit 120 into a parallel format for use by deframer circuit 505. Deframer circuit 505 checks if the destination address field in the received frame correlates with the drive electronics circuit's preprogrammed selection address. If the addresses are the same, deframer circuit 505 determines if the information being transmitted is data or a command, then stores the information in track buffer 507 using one of two DMA pointers, one for data storage and the other for command storage. Track buffer circuit 507 is capable of storing one complete physical track of information for transmission to the associated commodity disk drive 122-1. Deframer circuit 505 generates an interrupt when the transfer of a physical track of information is completed. The interrupt generated by deframer 505 is transmitted to processor 513, which interprets the command or data stored in track buffer 507 and acts accordingly. If processor 513 determines that the command is a data transfer command it initializes the control registers 512 for the data transfer. Processor 513 also activates ESDI control circuit 509 which provides the physical interface between the associated commodity disk drive 122-1 and the internal circuit of drive electronics circuit 303-1. Processor 513 also activates disk data controller circuit 508 which functions to interface commodity disk drives with microprocessor controlled systems. The disk data controller 508 is responsible for the data transfer from track buffer 507 to the ESDI control circuit 509. Therefore, the data path is from track buffer 507 through disk data controller 508 and ESDI control circuit 509 to the commodity disk drive 122-1. The ESDI control circuit 509 simply provides the electrical interface between drive electronics circuit 303-1 and disk drive 122-1.

Data transfers from the disk drive 122-1 to input/output circuit 120 are accomplished in similar fashion. The data is read by processor 513 in response to a request for a data read from control unit 101 by addressing the data on disk drive 122-1 via ESDI control circuit 509. The data read from drive 122-1 is routed through ESDI control circuit 509 and disk data controller 508 to track buffer 507 where it is stored until a complete physical track or a meaningful part thereof is stored therein. Framer 506 retrieves the physical track from track buffer 507 and formats and frames this physical track and forwards it to transmitter circuit 504. Transmitter circuit 504 transmits the frames serially through one of the eight inbound data links via multiplexer 502 to input/output circuit 120.

Dynamic Virtual Device to Logical Device Mapping

With respect to data transfer operations, all data transfers go through cache memory 113. Therefore, front end or channel transfer operations are completely independent of backend or device transfer operations. In this system, staging operations are similar to staging in other cached disk subsystems but destaging transfers are collected into groups for bulk transfers. In addition, this data storage subsystem 100 simultaneously performs free space collection, mapping table backup, and error recovery as background processes. Because of the complete front end/backend separation, the data storage subsystem 100 is liberated from the exacting processor timing dependencies of previous Count Key Data disk subsystems. The subsystem is free to dedicate its processing resources to increasing performance through more intelligent scheduling and data transfer control.

The disk drive array data storage subsystem 100 consists of three abstract layers: virtual, logical and physical. The virtual layer functions as a conventional large form factor disk drive memory. The logical layer functions as an array of storage units that are grouped into a plurality of redundancy groups (ex 122-1 to 122-n+m), each containing N+M disk drives to store N physical tracks of data and M physical tracks of redundancy information for each logical track. The physical layer functions as a plurality of individual small form factor disk drives. The data storage management system operates to effectuate the mapping of data among these abstract layers and to control the allocation and management of the actual space on the physical devices. These data storage management functions are performed in a manner that renders the operation of the disk drive array data storage subsystem 100 transparent to the host processors (11-12).

A redundancy group consists of N+M disk drives. The redundancy group is also called a logical volume or a logical device. Within each logical device there are a plurality of logical tracks, each of which is the set of all physical tracks in the redundancy group which have the same physical track address. These logical tracks are also organized into logical cylinders, each of which is the collection of all logical tracks within a redundancy group which can be accessed at a common logical actuator position. Disk drive array data storage subsystem 100 appears to the host processor to be a collection of large form factor disk drives, each of which contains a predetermined number of tracks of a predetermined size called a virtual track. Therefore, when the host processor 11 transmits data over the data channel 21 to the data storage subsystem 100, the data is transmitted in the form of the individual records of a virtual track. In order to render the operation of the disk drive array data storage subsystem 100 transparent to the host processor the received data is stored on the actual physical disk drives (122-1 to 122-n+m) in the form of virtual track instances which reflect the capacity of a track on the large form factor disk drive that is emulated by data storage subsystem 100. Although a virtual track instance may spill over from one physical track to the next physical track, a virtual track instance is not permitted to spill over from one logical cylinder to another. This is done in order to simplify the management of the memory space.

When a virtual track is modified by the host processor 11, the updated instance of the virtual track is not rewritten in data storage subsystem 100 at its original location but is instead written to a new logical cylinder and the previous instance of the virtual track is marked obsolete. Therefore, over time a logical cylinder becomes riddled with "holes" of obsolete data known as free space. In order to create whole free logical cylinders, virtual track instances that are still valid and located among fragmented free space within a logical cylinder are relocated within the disk drive array data storage subsystem 100 in order to create entirely free logical cylinders. In order to evenly distribute data transfer activity, the tracks of each virtual device are scattered as uniformly as possible among the logical devices in the disk drive array data storage subsystem 100. In addition, virtual track instances are padded out if necessary to fit into an integral number of physical device sectors. This is to insure that each virtual track instance starts on a sector boundary of the physical device.

Virtual Track Directory

Figure 9:
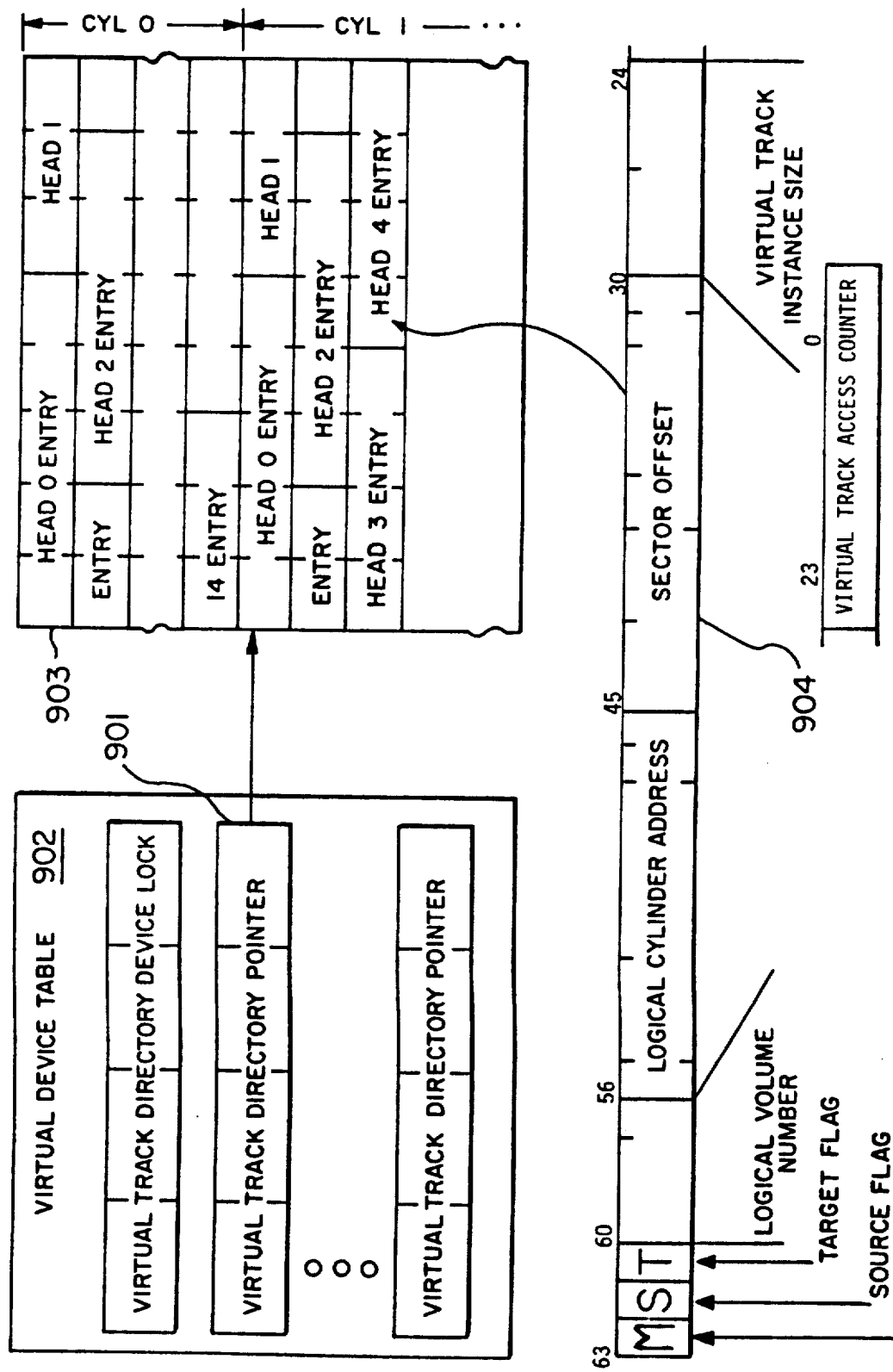
FIG. 9 illustrates the format of the virtual track directory.

FIG. 9 illustrates the format of the virtual track directory 900 that is contained within cache memory 113. The virtual track directory 900 consists of the tables that map the virtual addresses as presented by host processor 11 to the logical drive addresses that is used by control unit 101. There is another mapping that takes place within control unit 101 and this is the logical to physical mapping to translate the logical address defined by the virtual track directory 900 into the exact physical location of the particular disk drive or secondary media that contains data identified by the host processor 11. The virtual track directory 900 is made up of two parts: the virtual track directory pointers 901 in the virtual device table 902 and the virtual track directory 903 itself. The virtual track directory 903 is not contiguous in cache memory 113 but is scattered about the physical extent of cache memory 113 in predefined segments (ex 903-1). Each segment 903-1 has a virtual to logical mapping for a predetermined number of cylinders, for example 64 cylinders worth of IBM 3380 type DASD tracks. In the virtual device table 902, there are pointers to as many of these segments 903 as needed to emulate the number of cylinders configured for each of the virtual devices defined by host processor 11. The virtual track directory 900 is created by control unit 101 at the virtual device configuration time. When a virtual volume is configured, the number of cylinders in that volume is defined by the host processor 11. A segment 903-1 or a plurality of segments of volatile cache memory 113 are allocated to this virtual volume defined by host processor 11 and the virtual device table 902 is updated with the pointers to identify these segments 903 contained within cache memory 113. Each segment 903 is initialized with no pointers to indicate that the virtual tracks contained on this virtual volume have not yet been written. Each entry 905 in the virtual device table is for a single virtual track and is addressed by the virtual track address. As shown in FIG. 9, each entry 905 is 64 bits long. The entry 905 contents are as follows starting with the high order bits:

Bits 63: Migrated to Secondary Media Flag.
Bit 62: Source Flag.
Bit 61: Target Flag.
Bits 60-57: Logical volume number. This entry corresponds to the logical volume table described above.
Bits 56-46: Logical cylinder address. This data entry is identical to the physical cylinder number.
Bits 45-31 Sector offset. This entry is the offset to the start of the virtual track instance in the logical cylinder, not including the parity track sectors. These sectors are typically contained 512 bytes.
Bits 30-24: Virtual track instance size. This entry notes the number of sectors that are required to store this virtual track instance.
Bits 23-0: Virtual Track Access Counter. This entry contains a running count of the number of times the Virtual Track has been staged.

If the Migrated to Secondary Media Flag is clear, the rest of the entry contains the fields described above. If the Migrated to Secondary Media Flag is set, the Logical Cylinder containing the Virtual Track has been migrated to the Secondary Media and the rest of the entry contains a pointer to a Secondary Media Directory.

Secondary Media Directory

The Secondary Media Directory contains pointers to all the data that has been migrated and is no longer resident on the DASD contained in the subsystem. The Secondary Media Directory also contains a Retrieving flag for each Logical Cylinder indicating that the data is in the process of being retrieved. The Secondary Media Directory is kept in cache and is backed up along with the Virtual Track Directory to allow recovery in the event of a cache failure.

Logical Cylinder Directory

FIG. 12 illustrates the format of the Logical Cylinder Directory. Each Logical Cylinder that is written contains in its last few sectors a Logical Cylinder Directory (LCD). The LCD is an index to the data in the Logical Cylinder and is used primarily by Free Space Collection to determine which Virtual Tracks Instances in the Logical Cylinder are valid and need to be collected. FIG. 12 shows the LCD in graphic form. The Logical Cylinder Sequence Number uniquely identifies the Logical Cylinder and the sequence in which the Logical Cylinders were created. It is used primarily during Mapping Table Recovery operations. The Logical Address is used as a confirmation of the Cylinders location for data integrity considerations. The LCD Entry count is the number of Virtual Track Instances contained in the Logical Cylinder and is used when scanning the LCD Entries. The Logical Cylinder Collection History contains when the cylinder was created, whether it was created from Updated Virtual Track Instances or was created from data collected from another cylinder, and if it was created from collected data, what was the nature of the collected data. The LCD Entry itself contains the identifier of the virtual track and the identifier of the relative sector within the logical cylinder in which the virtual track instance begins.

Free Space Directory

The storage control also includes a free space directory (FIG. 8) which is a list of all of the logical cylinders in the disk drive array data storage subsystem 100 ordered by logical device. Each logical device is cataloged in two lists called the free space list and the free cylinder list for the logical device; each list entry represents a logical cylinder and indicates the amount of free space that this logical cylinder presently contains. This free space directory contains a positional entry for each logical cylinder; each entry includes both forward and backward pointers for the doubly linked free space list for its logical device and the number of free sectors contained in the logical cylinder. Each of these pointers points either to another entry in the free space list for its logical device or is null. In addition to the pointers and free sector count, the Free Space Directory also contains entries that do not relate to Free Space, but relate to the Logical Cylinder. There is a flag byte known as the Logical Cylinder Table (LCT) which contains, among other flags, a Collected Flag and an Archive Flag. The Collected Flag is set when the logical cylinder contains data that was collected from another cylinder. The Archive Flag is set when the logical cylinder contains data that was collected from a logical cylinder which had its Collected Flag set. If either one of these flags is set, the Access Counter and the Last Access Date/Time is valid. The Creation Time/Date is valid for any cylinder that is not free.

The collection of free space is a background process that is implemented in the disk drive array data storage subsystem 100. The free space collection process makes use of the logical cylinder directory, which is a list contained in the last few sectors of each logical cylinder, indicative of the contents of that logical cylinder. The logical cylinder directory contains an entry for each virtual track instance contained within the logical cylinder. The entry for each virtual track instance contains the identifier of the virtual track instance and the identifier of the relative sector within the logical cylinder in which the virtual track instance begins. From this directory and the virtual track directory, the free space collection process can determine which virtual track instances are still current in this logical cylinder and therefore need to be moved to another location to make the logical cylinder available for writing new data.

Data Read Operation

Figure 6:
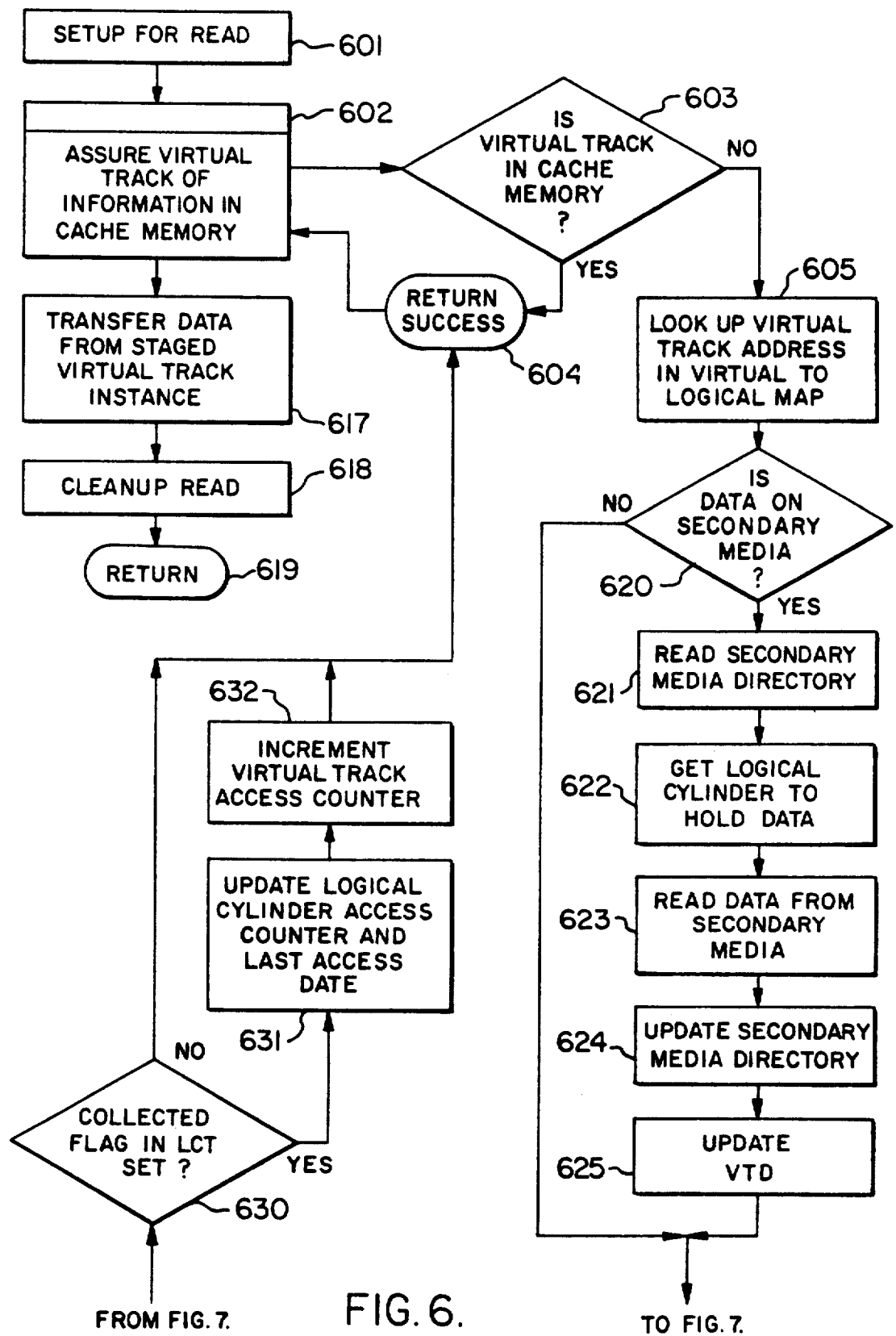
FIGS. 6 and 7 illustrate, in flow diagram form, the operational steps taken to perform a data read operation.
Figure 7:
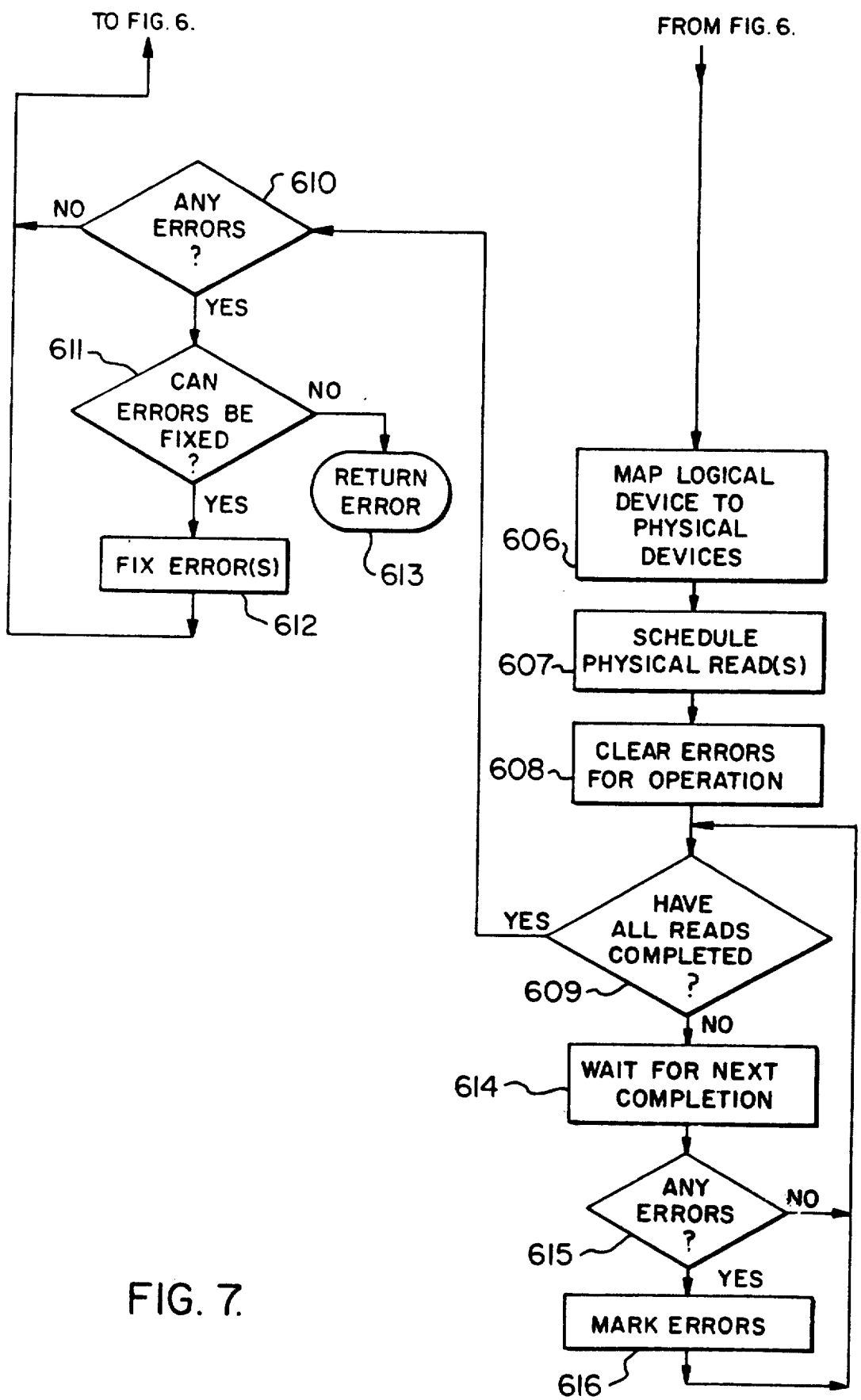

FIGS. 6 and 7 illustrate in flow diagram form the operational steps taken by processor 204 in control unit 101 of the data storage subsystem 100 to read data from a data redundancy group 122-1 to 122-n+m in the disk drive subsets 103. The disk drive array data storage subsystem 100 supports reads of any size. However, the logical layer only supports reads of virtual track instances. In order to perform a read operation, the virtual track instance that contains the data to be read is staged from the logical layer into the cache memory 113. The data record is then transferred from the cache memory 113 and any clean up is performed to complete the read operation.

At step 601, the control unit 101 prepares to read a record from a virtual track. At step 602, the control unit 101 branches to the cache directory search subroutine to assure that the virtual track is located in the cache memory 113 since the virtual track may already have been staged into the cache memory 113 and stored therein in addition to having a copy stored on the plurality of disk drives (122-1 to 122-n+m) that constitute the redundancy group in which the virtual track is stored. At step 603, the control unit 101 scans the hash table directory of the cache memory 113 to determine whether the requested virtual track is located in the cache memory 113. If it is, at step 604 control returns back to the main read operation routine and the cache staging subroutine that constitutes steps 605-616 is terminated.

Assume, for the purpose of this description, that the virtual track that has been requested is not located in the cache memory 113. Processing proceeds to step 605 where the control unit 101 looks up the address of the virtual track in the virtual to logical map table. At step 620, control unit 101 determines whether the requested virtual track resides on secondary media by reviewing the contents of the virtual track directory as described above. If the requested virtual track is not on secondary media, processing advances to step 606 as described below.

Retrieve Logical Cylinder From Secondary Media

If the requested virtual track is archived on secondary media, control unit 101 branches to step 621 where it reads the secondary media directory, located in cache memory 113 to obtain the pointer indicative of the physical location of the requested virtual track, for example on magnetic tape IOA. At step 622, control unit 101 obtains an unused logical cylinder in disk drive array 100 to store the logical cylinder containing the requested virtual track, that is to be retrieved from the secondary media. At step 623, control unit 101 sets the Retrieving flag in the secondary media directory to indicate that the logical cylinder is in the process of being transferred from the secondary media. Control unit 101 reads the logical cylinder containing the requested virtual track from its location in the secondary media to the reserved logical cylinder. Once the requested logical track has been transferred to the reserved logical cylinder, at steps 624 and 625, control unit updates the status of this logical cylinder in the secondary media directory and virtual track directory, respectively. Logical Track Staging The control unit 101 allocates space in cache memory 113 for the data and relocates the logical address to the cache directory. At step 606, the logical map location is used to map the logical device to one or more physical devices in the redundancy group. At step 607, the control unit 101 schedules one or more physical read operations to retrieve the virtual track instance from appropriate ones of identified physical devices 122-1 to 122-n+m. At step 608, the control unit 101 clears errors for these operations. At step 609, a determination is made whether all the reads have been completed, since the requested virtual track instance may be stored on more than one of the N+M disk drives in a redundancy group. If all of the reads have not been completed, processing proceeds to step 614 where the control unit 101 waits for the next completion of a read operation by one of the N+M disk drives in the redundancy group. At step 615 the next reading disk drive has completed its operation and a determination is made whether there are any errors in the read operation that has just been completed. If there are errors, at step 616 the errors are marked and control proceeds back to the beginning of step 609 where a determination is made whether all the reads have been completed. If at this point all the reads have been completed and all portions of the virtual track instance have been retrieved from the redundancy group, then processing proceeds to step 610 where a determination is made whether there are any errors in the reads that have been completed. If errors are detected then at step 611 a determination is made whether the errors can be fixed. One error correction method is the use of a Reed-Solomon error detection/correction code to recreate the data that cannot be read directly. If the errors cannot be repaired then a flag is set to indicate to the control unit 101 that the virtual track instance can not be read accurately. If the errors can be fixed, then in step 612 the identified errors are corrected and processing . . . proceeds to step 630 where a test of the Collected Flag in the Logical Cylinder Table (LCT) is made. If the Collected Flag is clear, steps 631 and 632 are skipped and processing proceeds to step 604. If the Collected Flag is set, processing proceeds to step 631 where the Logical Cylinder Access Counter is incremented and the Last Access Time/data is loaded with the current time and date. Processing then . . . returns back to the main routine at step 604 where a successful read of the virtual track instance from the redundancy group to the cache memory 113 has been completed.

At step 617, control unit 101 transfers the requested data record from the staged virtual track instance in which it is presently stored. Once the records of interest from the staged virtual track have been transferred to the host processor 11 that requested this information, then at step 618 the control unit 101 cleans up the read operation by performing the administrative tasks necessary to place all of the apparatus required to stage the virtual track instance from the redundancy group to the cache memory 113 into an idle state and control returns at step 619 to service the next operation that is requested.

Data Write Operation

Figure 13:
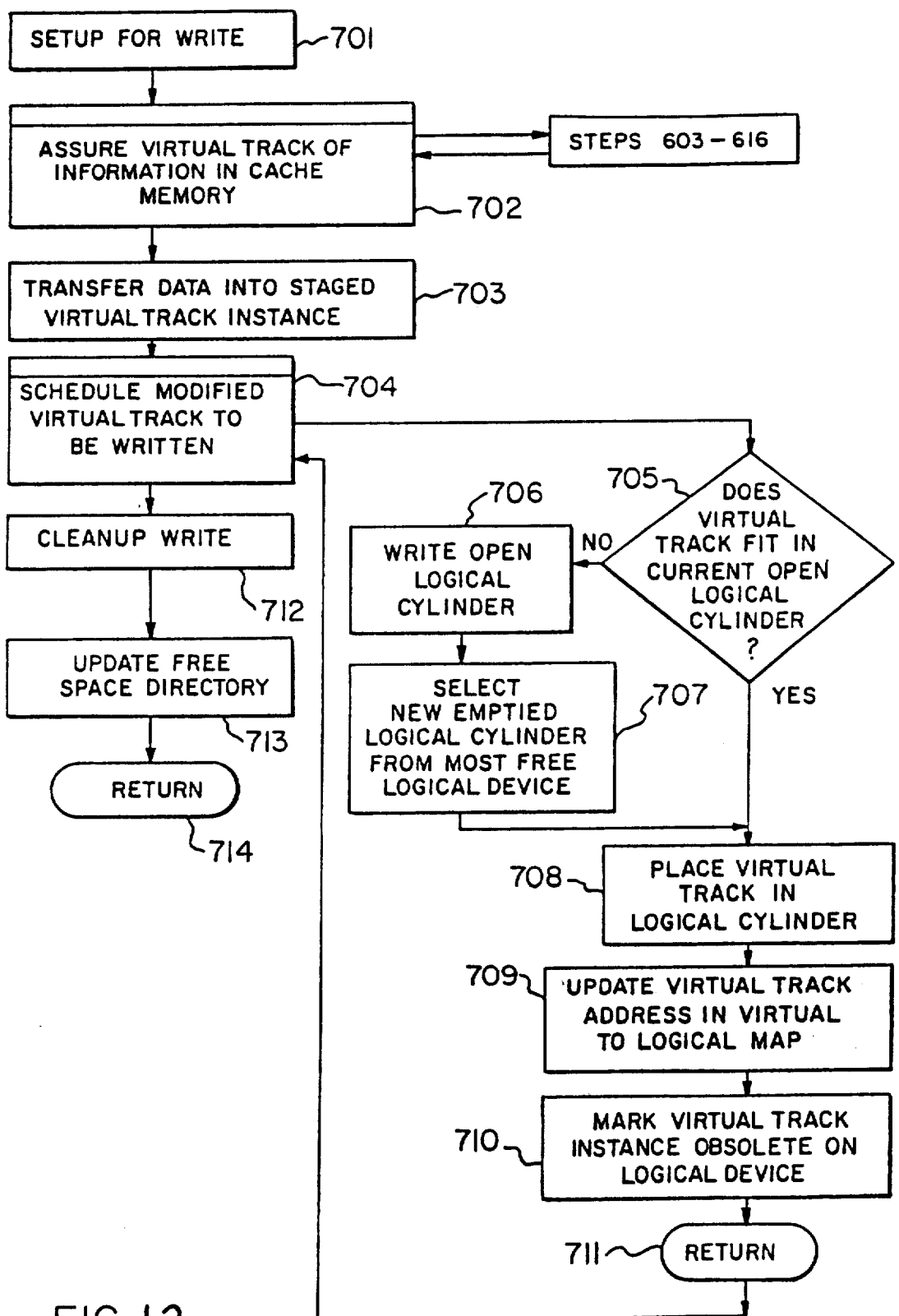
FIG. 13 illustrates, in flow diagram form, the operational steps taken to perform a data write operation.

FIG. 13 illustrates in flow diagram form the operational steps taken by the disk drive array data storage subsystem 100 to perform a data write operation. The disk drive array data storage subsystem 100 supports writes of any size, but again, the logical layer only supports writes of virtual track instances. Therefore in order to perform a write operation, the virtual track that contains the data record to be rewritten is staged from the logical layer into the cache memory 113. The modified data record is then transferred into the virtual track modified and this updated virtual track instance is then scheduled to be written from the cache memory 113 where the data record modification has taken place into the logical layer. Once the backend write operation is complete, the location of the obsolete instance of the virtual track is marked as free space. Any clean up of the write operation is then performed once this transfer and write is completed.

At step 701, the control unit 101 performs the set up for a write operation and at step 702, as with the read operation described above, the control unit 101 branches to the cache directory search subroutine to assure that the virtual track into which the data is to be transferred is located in the cache memory 113. Since all of the data updating is performed in the cache memory 113, the virtual track in which this data is to be written must be transferred from the redundancy group in which it is stored to the cache memory 113 if it is not already resident in the cache memory 113. The transfer of the requested virtual track instance to the cache memory 113 is performed for a write operation as it is described above with respect to a data read operation and constitutes steps 603-616 illustrated in FIG. 6 above.

At step 703, the control unit 101 transfers the modified record data received from host processor 11 into the virtual track that has been retrieved from the redundancy group into the cache memory 113 to thereby merge this modified record data into the original virtual track instance that was retrieved from the redundancy group. Once this merge has been completed and the virtual track now is updated with the modified record data received from host processor 11, the control unit 101 must schedule this updated virtual track instance to be written onto a redundancy group somewhere in the disk drive array data storage subsystem 100.

This scheduling is accomplished by the subroutine that consists of steps 705-710. At step 705, the control unit 101 determines whether the virtual track instance as updated fits into an available open logical cylinder. If it does not fit into an available open logical cylinder, then at step 706 this presently open logical cylinder must be closed out and written to the physical layer and another logical cylinder selected from the most free logical device or redundancy group in the disk drive array data storage subsystem 100. At step 707, the selection of a free logical cylinder from the most free logical device takes place. This ensures that the data files received from host processor 11 are distributed across the plurality of redundancy groups in the disk drive array data storage subsystem 100 in an even manner to avoid overloading certain redundancy groups while underloading other redundancy groups. Once a free logical cylinder is available, either being the presently open logical cylinder or a newly selected logical cylinder, then at step 708, the control unit 101 writes the updated virtual track instance into the logical cylinder and at step 709 the new location of the virtual track is placed in the virtual to logical map in order to render it available to the host processors 11-12. At step 710, the control unit 101 marks the virtual track instance that is stored in the redundancy group as invalid in order to assure that the logical location at which this virtual track instance is stored is not accessed in response to another host processor 12 attempting to read or write the same virtual track. Since the modified record data is to be written into this virtual track in the cache memory 113, the copy of the virtual track that resides in the redundancy group is now inaccurate and must be removed from access by the host processors 11-12. At step 711, control returns to the main routine, where at step 712 the control unit 101 cleans up the remaining administrative tasks to complete the write operation. At step 713, the processor 204 updates the free space directory to reflect the additional free space in the logical cylinder that contained the previous track instance and return to an available state at 714 for further read or write operations from host processor 11.

Free Space Collection

Figure 8:
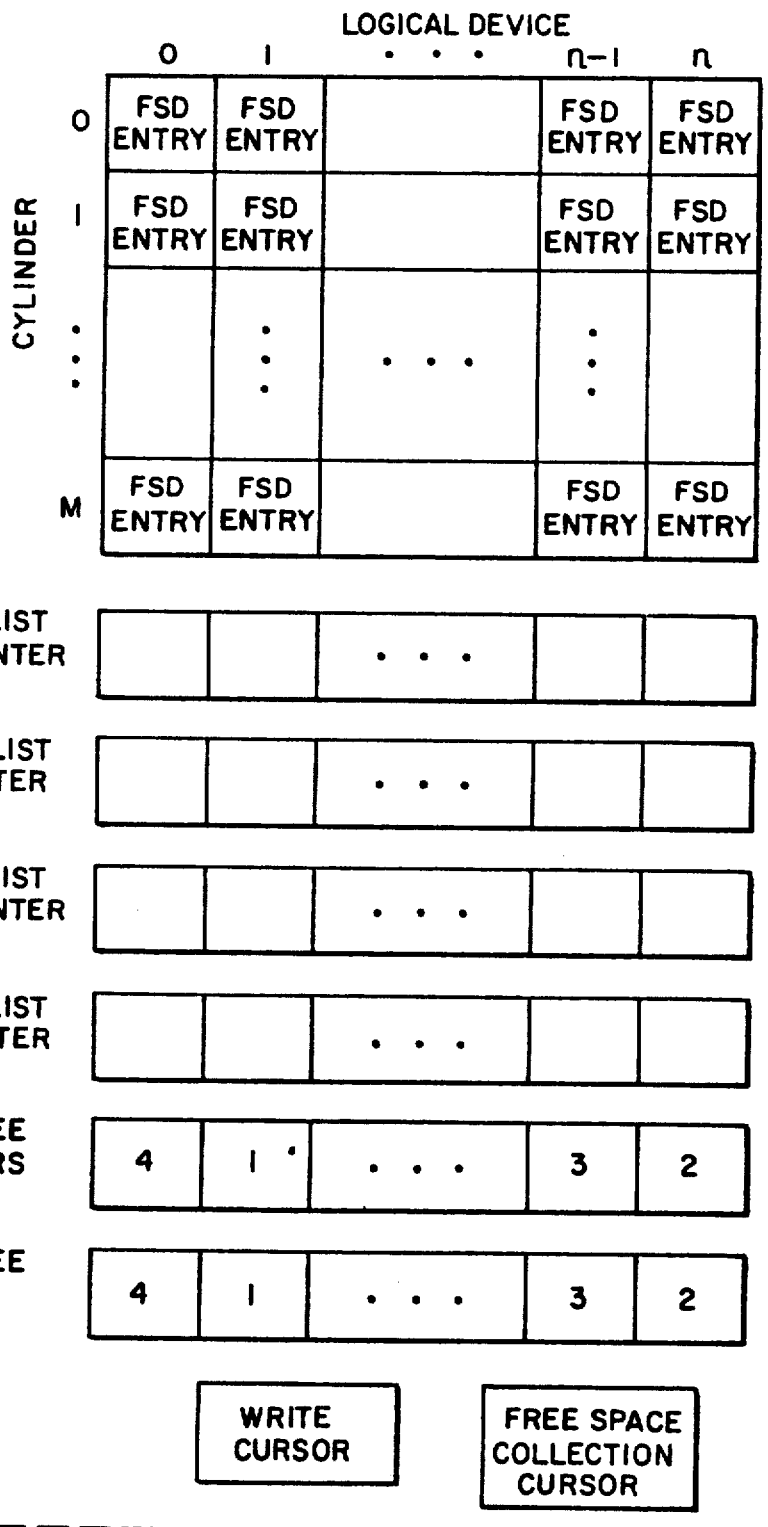
FIG. 8 illustrates a typical free space directory used in the data storage subsystem.

When data in cache memory 113 is modified, it cannot be written back to its previous location on a disk drive in disk drive subsets 103 since that would invalidate the redundancy information on that logical track for the redundancy group. Therefore, once a virtual track has been updated, that track must be written to a new location in the data storage subsystem 100 and the data in the previous location must be marked as free space. Therefore, in each redundancy group, the logical cylinders become riddled with "holes" of obsolete data in the form of virtual track instances that are marked as obsolete. In order to create completely empty logical cylinders for destaging, the valid data in partially valid cylinders must be read into cache memory 113 and rewritten into new previously emptied logical cylinders. This process is called free space collection. The free space collection function is accomplished by control unit 101. Control unit 101 selects a logical cylinder that needs to be collected as a function of how much free space it contains. The free space determination is based on the free space directory as illustrated in FIG. 8, which indicates the availability of unused memory in data storage subsystem 100. The table illustrated in FIG. 8 is a listing of all of the logical devices contained in data storage subsystem 100 and the identification of each of the logical cylinders contained therein. The entries in this chart represent the number of free physical sectors in this particular logical cylinder. A write cursor is maintained in memory and this write cursor indicates the available open logical cylinder that control unit 101 will write to when data is destaged from cache 113 after modification by associated host processor 11-12 or as part of a free space collection process. In addition, a free space collection cursor is maintained which points to the present logical cylinder that is being cleared as part of a free space collection process. Therefore, control unit 101 can review the free space directory illustrated in FIG. 8 as a backend process to determine which logical cylinder on a logical device would most benefit from free space collection. Control unit 101 activates the free space collection process by reading all of the valid data from the selected logical cylinder into cache memory 113. The logical cylinder is then listed as completely empty and linked into the Free Cylinder List since all of the virtual track instances therein are tagged as obsolete. Additional logical cylinders are collected for free space collection purposes or as data is received from an associated host processor 11-12 until a complete logical cylinder has been filled. Once a complete logical cylinder has been filled, a new previously emptied logical cylinder is chosen.

Figure 10:
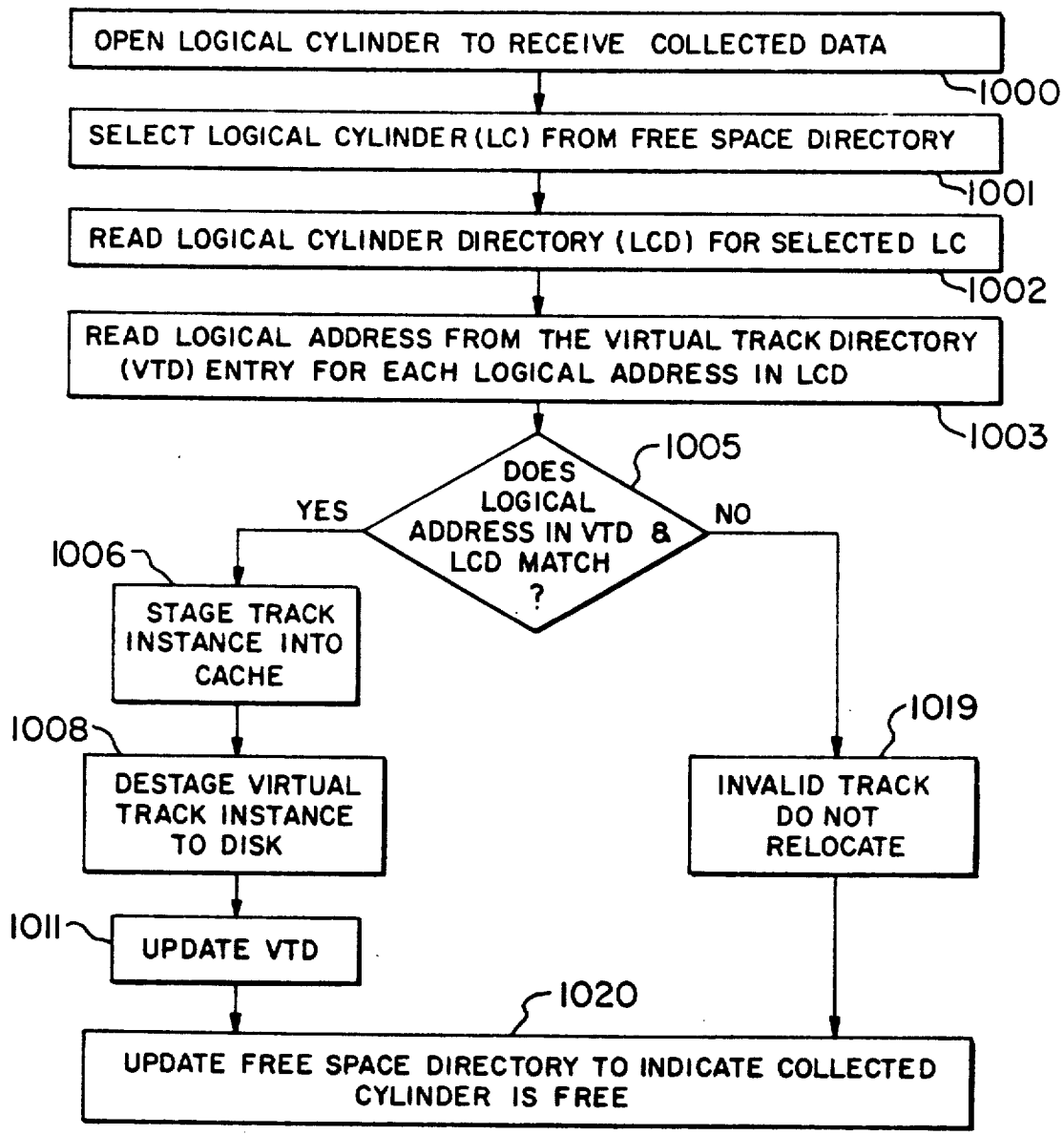
FIGS. 10 and 11 illustrates, in flow diagram form, the basic and enhanced free space collection processes, respectively.

FIG. 10 illustrates in flow diagram form the operational steps taken by processor 204 to implement the free space collection process. When Free Space collection has to be done, the best logical cylinder to collect is the one with the most sectors already free. This leads to the notion of a list of all of the logical cylinders in data storage subsystem 100 ordered by the amount of Free Space each contains. Actually, a list is maintained for each logical device, since it is desirable to balance free space across logical devices to spread virtual actuator contention as evenly as possible over the logical actuators. The collection of lists is called the Free Space Directory; the list for each logical device is called the Free Space List for the logical device. Each free space entry represents a logical cylinder. Each free space directory entry (FIG. 14) contains a forward and backward pointer to create a double linked list as well. Each logical device's Free Space Link List is terminated by head and a tail pointers.

Each logical cylinder contains in its last few sectors a directory of its contents, called its Logical Cylinder Directory (LCD). This directory contains an entry for each virtual track instance contained within the logical cylinder. The entry for a virtual track instance contains the identifier of the virtual track and the identifier of the relative sector within the logical cylinder in which the virtual track instance begins. From this directory, the serial number of the logical cylinder instance, and the Virtual Track Directory, the Free Space Collection Process can determine which virtual track instances are still current in the logical cylinder and therefore need to be moved to make the logical cylinder available for writing new data.

The basic process is initiated at step 1000 when processor 204 opens a logical cylinder to receive data collected, then proceeds to step 1001 where processor 204 selects a Logical Cylinder (LC) for collection based on the number of free logical sectors as listed in the Free Space Directory table of FIG. 8. At step 1002, processor 204 reads the logical cylinder directory for the logical cylinder that was selected at step 1001. Processor 204 then at step 1003 reads the logical address from the virtual track directory (VTD) entry for each virtual track address that is contained in the read logical cylinder directory. At step 1005, processor 204 compares the logical address that was stored in the virtual track directory entry with the logical address that was stored in the logical cylinder directory. If these two addresses do not match, that indicates the track instance is not valid for this virtual address and at step 1017 processor 204 determines that this track should not be relocated and execution exits.

If, at step 1005, processor 204 determines that the virtual address stored in the virtual track descriptor matches the virtual address stored in the logical cylinder directory, at step 1006 the virtual track instance is staged into predetermined location in cache memory 113. Processor 204 destages the virtual track instance to the disk drive subset 103 that contains the logical cylinder used by this free space collection process at step 1008 At step 1011, processor 204 updates the virtual track directory entry and exits at step 1020. At step 1020, processor 204 updates the free space directory to indicate that the collected cylinder is now a free cylinder available for data storage purposes and the data previously contained therein has been collected to a designated logical cylinder and the appropriate mapping table entries have been updated.

Enhanced Free Space Collection

Figure 11:
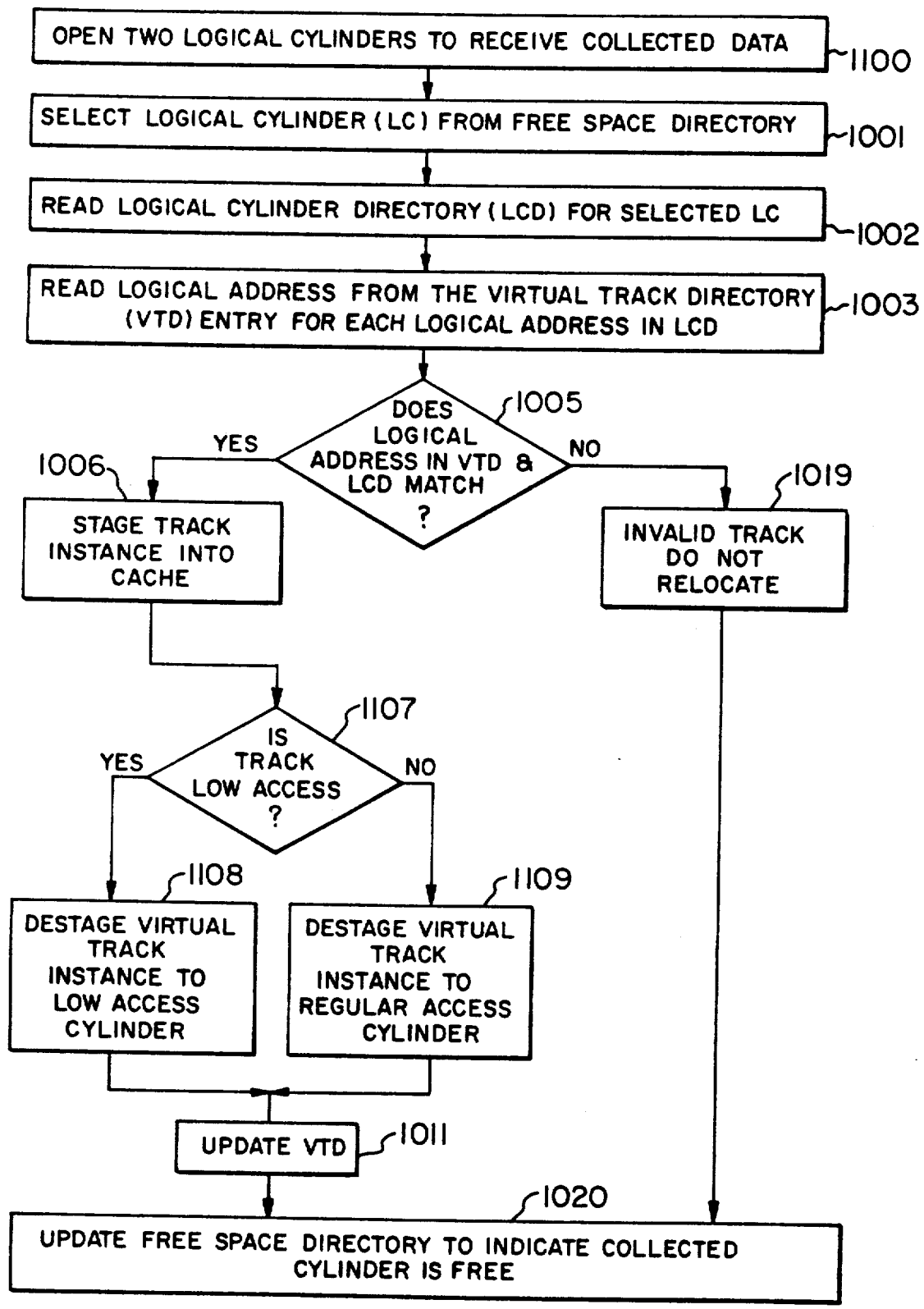

Enhanced Free Space Collection occurs when a cylinder is collected that has already been collected before, as indicated by the Collected Flag in the Logical Cylinder Table (LCT). When data is collected and written to a cylinder separate from the normal destaging cylinder, that data is Read-Only or Low Access relative to the rest of the data in the Logical Cylinder, since any data that is updated is written to new cylinders. Data that is collected a second time is Read-Only or Low Access relative to all the data in the subsystem so it is Archive data. When Free Space Collection collects a cylinder that has not been collected before, the basic Free Space Collection Algorithm, as described in the previous section, is used. When Free Space Collection collects a cylinder that has the Collected or the Archive Flag in the LCT set, the Enhanced Free Space Collection Algorithm is used. FIG. 11 illustrates in flow diagram form the operational steps taken by processor 204 in control unit 101 of the data storage subsystem 100 to perform Enhanced Free Space Collection. The differences between Basic and Enhanced Free Space Collection are minor, but they are important to the hierarchical algorithm since they differentiate data into Low Access and Regular Access Logical Cylinders. In step 1100, we allocate two logical cylinders to receive the data collected during free space collection. One cylinder is used for Low Access Data and the other is used for Regular Access Data. Steps 1001 through 1006 are the same as the basic algorithm. At step 1107 there is a test to determine if the virtual track that has been read from the cylinder being collected is Low Access. The track is low access if the Virtual Track Access Counter from the VTD divided by the age of the logical cylinder is below a low access threshold. The age of the Logical Cylinder is calculated by subtracting the Creation Data/Time (in the LCD) from the Current Data/Time. If the virtual track is low access, the data is written, at step 1108 to the low access logical cylinder. If the virtual track is not low access, the data is written, at step 1109 to the regular access logical cylinder.

Migrate Logical Cylinder

Figure 15:
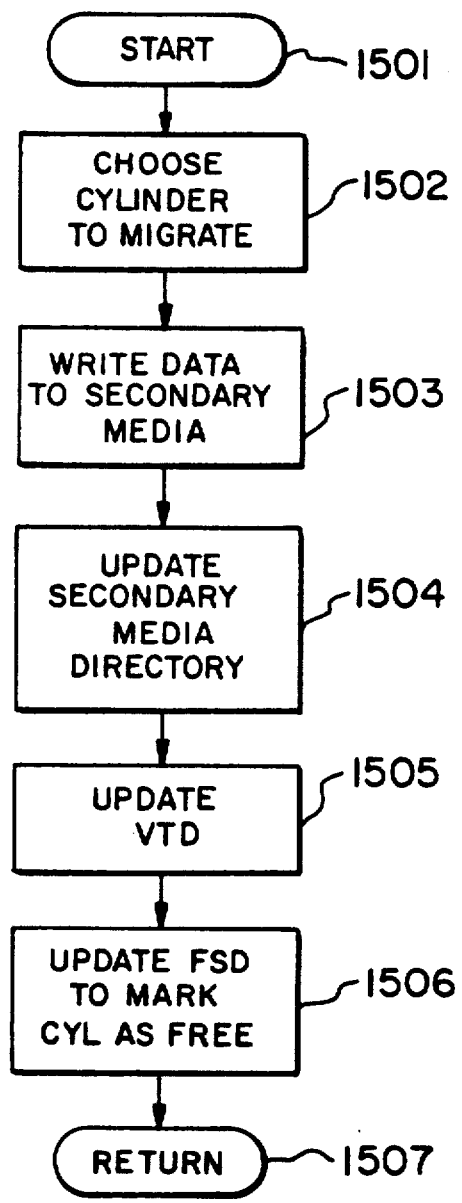
FIG. 15 illustrates, in flow diagram form, the migrate logical cylinder to secondary media process.

Data that is stored in Low Access Cylinders can be migrated to secondary media, such as magnetic tape 10A. This is accomplished automatically and dynamically in disk drive array 100 by control unit 101. The data migration process illustrated in FIG. 15 is initiated at step 1501 either periodically by control unit 101 to migrate data to secondary media on a regular basis or on a demand driven basis, such as when the number of available logical cylinders falls below a predetermined threshold. In either case, control unit initiates the migration process at step 1501 and selects a logical cylinder at step 1502, identified as a low access cylinder by calculating the access rate from the last three fields in the Free Space Directory Entry as illustrated in FIG. 14. At step 1503, control unit 101 writes the selected logical cylinder to secondary media 10A.

In operation, the selected logical cylinder is read from the redundancy group on which it is stored to cache memory 113 as described above. Once staged to cache memory 113, the selected logical cylinder is transferred to secondary media 10A via tape drive control unit 10 and data channel 20 in well-known manner as described above. Once the data write process is completed, control unit 101 at steps 1504, 1505 updates the status of the secondary media directory and virtual track directory, respectively to indicate the archived nature of the migrated logical cylinder. At step 1506, the logical cylinder in disk drive array 100 that stored the migrated logical cylinder is marked as free in the free space directory. The migration process concludes at step 1507 if no further logical cylinders are available for migration. Otherwise, the process of FIG. 15 is repeated.

While a specific embodiment of this invention has been disclosed herein, it is expected that those skilled in the art can design other embodiments that differ from this particular embodiment but fall within the scope of the appended claims.

I claim:

1. Apparatus for automatically archiving infrequently used data records onto more economical media in a dynamically mapped data storage subsystem that stores data records for at least one associated host processor, said dynamically mapped data storage subsystem including a plurality of disk drive devices, where the dynamically mapped data storage subsystem writes a stream of data records received from one of said associated host processors in available memory space on said disk drive devices, comprising:

cache memory means connected to and interconnecting said host processors and said disk drive devices for storing data records transmitted therebetween;

tape drive archive memory means connected to said cache memory means for storing data records that were previously stored on said disk drive devices by said associated host processors;

means, responsive to said host processor storing one of said data records in a first available memory location on said disk drive devices, for maintaining a count of the frequency of said host processor access of said one data record stored in said first available memory location on said disk drive devices;

means for comparing said maintained count to a predetermined threshold;

means, responsive to said threshold exceeding said count, for signifying said data record stored in said first available memory location on said disk drive devices as archivable;

means for transferring said archivable data record from said first available memory location on said disk drives to said cache memory means for archiving; and means, responsive to said archivable data record being transferred into said cache memory means, for rewriting said cached archivable data record stored from said cache memory means into said tape drive archive memory means.

2. The apparatus of claim 1 further including:
means, responsive to said rewriting means writing one of said data records into said tape drive archive memory means, for expunging the identity of said rewritten data record from said storing means.

3. The apparatus of claim 1 further including:
means for determining the amount of said available memory space in said disk drive devices; and
means for resetting said predetermined threshold as a function of said determined available memory space.

4. The apparatus of claim 3 wherein said resetting means includes:
means for storing data indicative of a minimum amount of available memory space; and
means for comparing said determined available memory space with said data indicative of a minimum amount of available memory space.

5. The apparatus of claim 4 wherein said resetting means further includes:
means, responsive to said determined available memory space not exceeding said data indicative of a minimum amount of available memory space, for incrementing said predetermined threshold by a predetermined amount.

6. The apparatus of claim 1 further comprising:
means, responsive to said rewriting means, for storing data indicative of the memory location in said tape drive archive memory means in which said data record is stored.

7. Apparatus for automatically archiving infrequently used data records onto more economical media in a dynamically mapped memory system that stores data records for at least one associated host processor, said dynamically mapped memory system including a plurality of disk drive devices, a subset of said plurality of disk drive devices being configured into a plurality of redundancy groups, each redundancy group consisting of at least two disk drive devices, where said dynamically mapped memory system writes a stream of data records received from said associated host processors and redundancy data associated with said received stream of data records in a first available memory location in a selected one of said redundancy groups, comprising:

cache memory means connected to and interconnecting said host processors and said disk drive devices for storing data records transmitted therebetween;

tape drive archive memory means connected to said cache memory means for storing data records which were previously stored in said redundancy groups by said associated host processors:

means, responsive to said host processor storing one of said data records in a first available memory location in a selected one of said redundancy groups, for maintaining a count of the frequency of said host processor access of said one data record in said first available memory location in said selected one of said redundancy groups;

means for comparing said maintained count to a predetermined threshold;

means, responsive to said threshold exceeding said count, for signifying said data record stored in said first available memory location in said selected one of said redundancy groups as archivable;

means for transferring said archivable data record from said first available memory location in said selected one of said redundancy groups to said cache memory means for archiving; and means, responsive to said archivable data record being transferred into said cache memory means, for rewriting said cached archivable data record into said tape drive archive memory means.

8. The apparatus of claim 7 further including:
means, responsive to said rewriting means writing said archivable data record into said tape drive archive memory means, for expunging the identity of said rewritten archivable data record from said storing means.

9. The apparatus of claim 7, wherein said tape drive archive memory means comprises at least one tape drive, further comprising:
means connected to and interconnecting said cache memory means and said tape drive for transferring data therebetween;
wherein said writing means includes:
means for staging said modified data record from said first location in a selected one of said redundancy groups to said cache memory means,
means for transmitting said staged modified data record from said cache memory means to said transferring means.

10. The apparatus of claim 7 further including:
means for determining the amount of said available memory space in said disk drive devices; and
means for resetting said predetermined threshold as a function of said determined available memory space.

11. The apparatus of claim 10 wherein said resetting means includes:
means for storing data indicative of a minimum amount of available memory space; and
means for comparing said determined available memory space with said data indicative of a minimum amount of available memory space.

12. The apparatus of claim 11 wherein said resetting means further includes:

means, responsive to said determined available memory space not exceeding said data indicative of a minimum amount of available memory space, for incrementing said predetermined threshold by a predetermined amount.

13. The apparatus of claim 7 further comprising:

means, responsive to said rewriting means, for storing data indicative of the memory location in said tape drive archive memory means in which said data record is stored.

14. Apparatus for automatically archiving data records stored in a dynamically mapped data storage subsystem that stores data records for at least one associated data processor, said dynamically mapped data storage subsystem including a plurality of data storage devices, a subset of said plurality of said data storage devices configured into at least one redundancy group, each redundancy group consisting of n+m data storage devices, where n and m are both positive integers with n being greater than 1 and m being equal to or greater than 1, and said data storage devices each including a like plurality of physical tracks to form sets of physical tracks called logical tracks, each logical track having one physical track at the same relative address on each of said n+m data storage devices, for storing data records thereon, said dynamically mapped data storage subsystem generates m redundancy segments using n received streams of data records, selects a first one of said logical tracks in one of said redundancy groups, having at least one set of available physical tracks addressable at the same relative address for each of said n+m data storage devices and writes said n received streams of data records and said m redundancy segments on said n+m data storage devices in said selected set of physical tracks, each stream of data records and redundancy segment at said selected available logical track on a respective one of said n+m data storage devices, comprising:

cache memory means connected to and interconnecting said host processors and said data storage devices for storing data records transmitted therebetween;

archive memory means connected to said cache memory means for storing data records which were previously stored in said dynamically mapped data storage subsystem by said associated host processors;

means, responsive to said host processor storing one of said data records stored in a first available memory location on said memory devices, for maintaining a count of the frequency of said host processor access of said one data record;

means for comparing said maintained count to a predetermined threshold;

means, responsive to said threshold exceeding said count, for signifying said data record stored in said first memory location as archivable;

means for transferring said archivable data record from said first memory location to said cache memory means; and means for rewriting said cached archivable data record into said archive memory means.

15. The apparatus of claim 14 further including:

means, responsive to said rewriting means writing said archivable data record into said archive memory means, for expunging the identity of said rewritten archivable data record from said storing means.

16. The apparatus of claim 14, wherein said archive memory means comprises at least one tape drive, further comprising:

means connected to and interconnecting said cache memory means and said tape drive for transferring data therebetween;

wherein said writing means includes:

means for staging said modified data record from said first location in a selected one of said redundancy groups to said cache memory means, means for transmitting said staged modified data record from said cache memory means to said transferring means.

17. The apparatus of claim 14 further including:

means for determining the amount of said available memory space in said data storage devices; and means for resetting said predetermined threshold as a function of said determined available memory space.

18. The apparatus of claim 17 wherein said resetting means includes:

means for storing data indicative of a minimum amount of available memory space; and means for comparing said determined available memory space with said data indicative of a minimum amount of available memory space.

19. The apparatus of claim 18 wherein said resetting means further includes:

means, responsive to said determined available memory space not exceeding said data indicative of a minimum amount of available memory space, for incrementing said predetermined threshold by a predetermined amount.

20. The apparatus of claim 14 further comprising:

means, responsive to said rewriting means, for storing data indicative of the memory location in said archive memory means in which said data record is stored.

21. Apparatus for automatically archiving data records in a dynamically mapped data storage subsystem that stores data records for at least one associated host processor, said dynamically mapped data storage subsystem including a plurality of disk drive devices, where the dynamically mapped data storage subsystem writes a stream of data records received from one of said associated host processors in available memory space on said data storage devices, comprising:

cache memory means connected to and interconnecting said host processors and said disk drive devices for storing data records transmitted therebetween;

tape drive archive memory means connected to said cache memory means for storing data records which were previously stored on said disk drive devices by said associated host processors;

means, responsive to said host processor storing one of said data records in a first available memory location on said disk drive devices, for maintaining a count of the frequency of said host processor access of said one data record;

means for comparing said maintained count to a first predetermined threshold;

means, responsive to said first predetermined threshold exceeding said count, for signifying said data record stored in said first available memory location on said disk drive devices as a low frequency of access data record;

means for rewriting said data record stored in said first available memory location on said disk drive devices into a second available memory location on said disk drive devices;

means for comparing said maintained count for each of said data records stored in said second available memory location to a second predetermined threshold;

means, responsive to said second predetermined threshold exceeding said count, for signifying said data record stored in said second available memory location on said disk drive devices as an archivable data record; and means for rewriting said archivable data record stored in said second available memory location from said second available memory location into said tape drive archive memory means.

22. The apparatus of claim 21 further including:

means, responsive to said rewriting means writing one of said data records into said tape drive archive memory means, for expunging the identity of said rewritten data record from said storing means.

23. The apparatus of claim 21 further including:

means for determining the amount of said available memory space in said disk drive devices; and means for resetting said second predetermined threshold as a function of said determined available memory space.

24. The apparatus of claim 23 wherein said resetting means includes:

means for storing data indicative of a minimum amount of available memory space; and means for comparing said determined available memory space with said data indicative of a minimum amount of available memory space.

25. The apparatus of claim 24 wherein said resetting means further includes:

means, responsive to said determined available memory space not exceeding said data indicative of a minimum amount of available memory space, for incrementing said second predetermined threshold by a predetermined amount.

26. The apparatus of claim 21 further comprising:

means, responsive to said rewriting means, for storing data indicative of the memory location in said tape drive archive memory means in which said data record is stored.

27. Apparatus for automatically archiving data records in a dynamically mapped memory system that stores data records for at least one associated host processor, said dynamically mapped memory system including a plurality of disk drive devices, a subset of said plurality of disk drive devices being configured into a plurality of redundancy groups, each redundancy group consisting of at least two disk drive devices, where said dynamically mapped memory system writes a stream of data records received from said associated host processors and redundancy data associated with said received stream of data records in a first available memory location in a selected one of said redundancy groups, comprising:

cache memory means connected to an interconnecting said host processors and said disk drive devices for storing data records transmitted therebetween;

tape drive archive memory means connected to said cache memory means for storing data records which were previously stored in said plurality of redundancy groups by said associated host processors;

means, responsive to said host processor storing a data record in a first available memory location on disk drives in a first redundancy group, for maintaining a count of the frequency of said host processor access of said data record in said first available memory location in said first redundancy group;

means for comparing said maintained count to a first predetermined threshold;

means, responsive to said first predetermined threshold exceeding said count, for signifying said data record stored in said first available memory location in said first redundancy group as a low frequency of access data record;

means for rewriting said data record stored in said first available memory location in said first redundancy group into a second available memory location on disk drives in a second redundancy group;

means for comparing said maintained count for each of said data records stored in said second available memory location in said second redundancy group to a second predetermined threshold;

means, responsive to said second predetermined threshold exceeding said count, for signifying said data record stored in said second available memory location in said second redundancy group as archivable;

means for transferring said archivable data record from said second available memory location in said second redundancy group to said cache memory means for archiving; and means, responsive to said archivable data record being transferred into said cache memory means, for rewriting said cached archivable data record into said tape drive archive memory means.

28. The apparatus of claim 27 further including:

means, responsive to said rewriting means writing said archivable data record into said tape drive archive memory means, for expunging the identity of said rewritten archivable data record from said storing means.

29. The apparatus of claim 27, wherein said tape drive archive memory means comprises at least one tape drive, further comprising:

means connected to and interconnecting said cache memory means and said tape drive for transferring data therebetween;

wherein said writing means includes:

means for staging said modified data record from said second location in said second redundancy group to said cache memory means, means for transmitting said staged modified data record from said cache memory means to said transferring means.

30. The apparatus of claim 27 further including:

means for determining the amount of said available memory space in said disk drive devices; and means for resetting said second predetermined threshold as a function of said determined available memory space.

31. The apparatus of claim 30 wherein said resetting means includes:

means for storing data indicative of a minimum amount of available memory space; and means for comparing said determined available memory space with said data indicative of a minimum amount of available memory space.

32. The apparatus of claim 31 wherein said resetting means further includes:

means, responsive to said determined available memory space not exceeding said data indicative of a minimum amount of available memory space, for incrementing said second predetermined threshold by a predetermined amount.

33. The apparatus of claim 27 further comprising:

means, responsive to said rewriting means, for storing data indicative of the memory location in said tape drive archive memory means in which said data record is stored.

34. Apparatus for automatically archiving data records stored in a dynamically mapped data storage subsystem that stores data records for at least one associated data processor, said dynamically mapped data storage subsystem including a plurality of data storage devices, a subset of said plurality of said data storage devices configured into at least one redundancy group, each redundancy group consisting of n+m data storage devices, where n and m are both positive integers with n being greater than 1 and m being equal to or greater than 1, and said data storage devices each including a like plurality of physical tracks to form sets of physical tracks called logical tracks, each logical track having one physical track at the same relative address on each of said n+m data storage devices, for storing data records thereon, said dynamically mapped data storage subsystem generates m redundancy segments using n received streams of data records, selects a first one of said logical tracks in one of said redundancy groups, having at least one set of available physical tracks addressable at the same relative address for each of said n+m data storage devices and writes said n received streams of data records and said m redundancy segments on said n+m data storage devices in said selected set of physical tracks, each stream of data records and redundancy segment at said selected available logical track on a respective one of said n+m data storage devices, comprising:

cache memory means connected to and interconnecting said host processors and said data storage devices for storing data records transmitted therebetween;

archive memory means connected to said cache memory means for storing data records which were previously stored in said dynamically mapped data storage subsystem by said associated host processors;

means, responsive to said host processor storing one of said data records in a first available memory location on said memory devices, for maintaining a count of the frequency of said host processor access of said one data record;

means for comparing said maintained count to a first predetermined threshold;

means, responsive to said first predetermined threshold exceeding said count, for signifying said data record stored in said first memory location as a low frequency of access data record;

means for rewriting said data record stored in said first memory location into a second memory location on said memory devices;

means for comparing said maintained count for each of said data records stored in said second memory location to a second predetermined threshold;

means, responsive to said second predetermined threshold exceeding said count, for signifying said data record stored in said second memory location as archivable;

means for transferring said archivable data record from said second memory location to said cache memory means; and means for rewriting said cached archivable data record into said archive memory means.

35. The apparatus of claim 34 further including:

means, responsive to said rewriting means writing said archivable data record into said archive memory means, for expunging the identity of said rewritten archivable data record from said storing means.

36. The apparatus of claim 34, wherein said archive memory means comprises at least one tape drive, further comprising:

means connected to and interconnecting said cache memory means and said tape drive for transferring data therebetween;

wherein said writing means includes:

means for staging said modified data record from said second location in a selected one of said redundancy groups to said cache memory means, means for transmitting said staged modified data record from said cache memory means to said transferring means.

37. The apparatus of claim 34 further including:

means for determining the amount of said available memory space in said data storage devices; and means for resetting said second predetermined threshold as a function of said determined available memory space.

38. The apparatus of claim 37 wherein said resetting means includes:

means for storing data indicative of a minimum amount of available memory space; and means for comparing said determined available memory space with said data indicative of a minimum amount of available memory space.

39. The apparatus of claim 38 wherein said resetting means further includes:

means, responsive to said determined available memory space not exceeding said data indicative of a minimum amount of available memory space, for incrementing said second predetermined threshold by a predetermined amount.

40. The apparatus of claim 34 further comprising:

means, responsive to said rewriting means, for storing data indicative of the memory location in said archive memory means in which said data record is stored.

* * * * *